(12) United States Patent
Nagashima

(10) Patent No.: US 9,129,858 B2
(45) Date of Patent: Sep. 8, 2015

(54) SEMICONDUCTOR DEVICE

(71) Applicant: KABUSHIKI KAISHA TOSHIBA, Tokyo (JP)

(72) Inventor: Satoshi Nagashima, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/015,017

(22) Filed: Aug. 30, 2013

(65) Prior Publication Data

US 2014/0284698 A1  Sep. 25, 2014

(30) Foreign Application Priority Data

Mar. 22, 2013  (JP) .................................. 2013-060158

(51) Int. Cl.
| | | |
|---|---|---|
| *H01L 29/792* | (2006.01) | |
| *H01L 27/115* | (2006.01) | |
| *H01L 21/762* | (2006.01) | |
| *H01L 21/28* | (2006.01) | |
| *H01L 29/423* | (2006.01) | |

(52) U.S. Cl.
CPC ...... *H01L 27/1157* (2013.01); *H01L 21/28273* (2013.01); *H01L 21/28282* (2013.01); *H01L 21/76224* (2013.01); *H01L 27/11531* (2013.01); *H01L 27/11573* (2013.01); *H01L 29/4234* (2013.01); *H01L 29/42324* (2013.01)

(58) Field of Classification Search
CPC ...... H01L 27/1157; H01L 21/76224; H01L 21/28273; H01L 21/28282; H01L 27/11531; H01L 27/11573; H01L 29/42324; H01L 29/4234

USPC .......................... 257/316, 317, 321, 324, 326
See application file for complete search history.

(56) References Cited

U.S. PATENT DOCUMENTS

| | | | |
|---|---|---|---|
| 6,228,782 B1 * | 5/2001 | Fang et al. ..................... | 438/400 |
| 2009/0294831 A1 | 12/2009 | Hu | |
| 2012/0025289 A1 * | 2/2012 | Liang et al. .................... | 257/316 |
| 2013/0069174 A1 * | 3/2013 | Chuang et al. ................. | 257/410 |

FOREIGN PATENT DOCUMENTS

| | | |
|---|---|---|
| JP | 2006-196838 A | 7/2006 |
| JP | 2008-270260 A | 11/2008 |
| JP | 2010-205822 A | 9/2010 |

OTHER PUBLICATIONS

Japanese Office Action with English Translation, Patent Application No. JP 2013-060158, dispatch date May 12, 2015.

* cited by examiner

*Primary Examiner* — Hung Vu

(74) *Attorney, Agent, or Firm* — Patterson & Sheridan, LLP

(57) ABSTRACT

A semiconductor device includes a memory cell transistor that is formed via a first gate insulating film on an active region of a memory cell region and has a gate electrode including a first charge storage layer, a first interelectrode insulating film, and a first control gate electrode film. A transistor, which includes a second gate insulating film on the active region or a peripheral circuit region and a gate electrode including a second charge storage layer, a second interelectrode insulating film, and a second control gate electrode film, is also provided. A groove with a funnel shape is formed in a trap film of the second charge storage layer, and the second control gate electrode film and the polysilicon film of the second charge storage layer are interconnected via the groove.

20 Claims, 24 Drawing Sheets

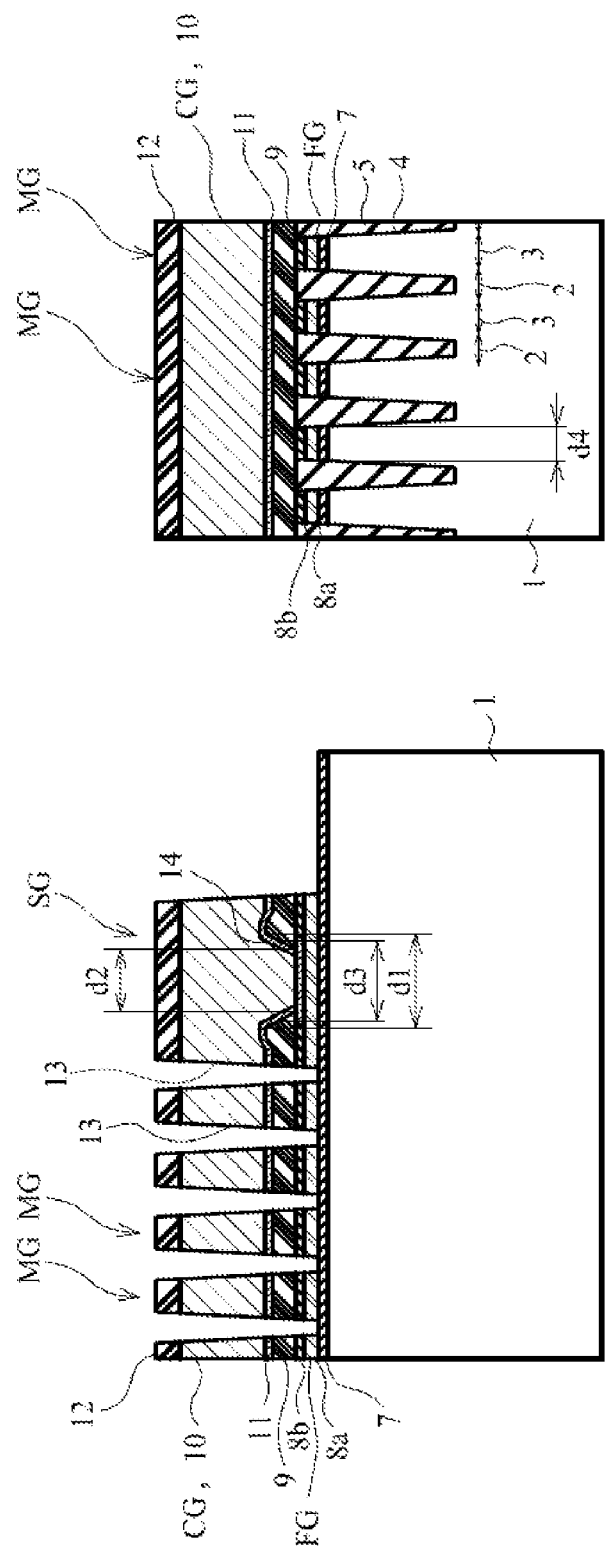

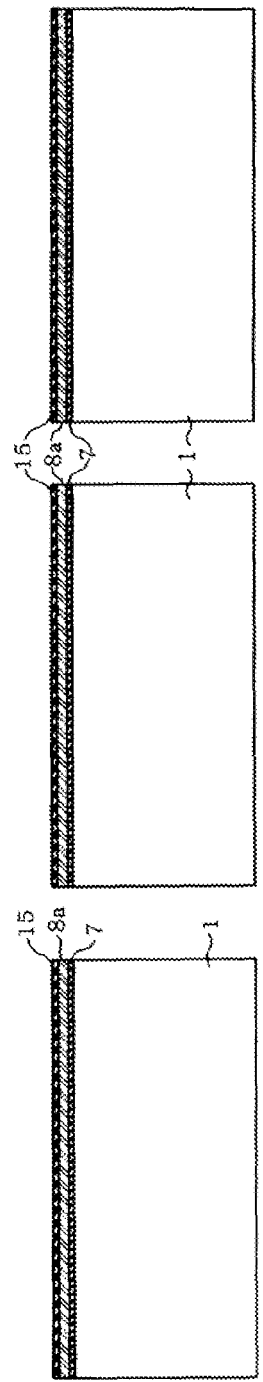

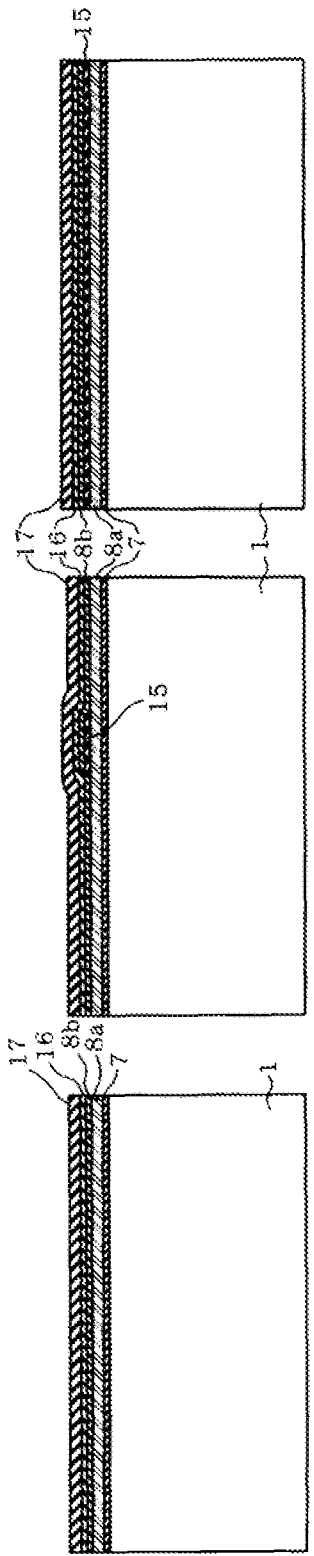

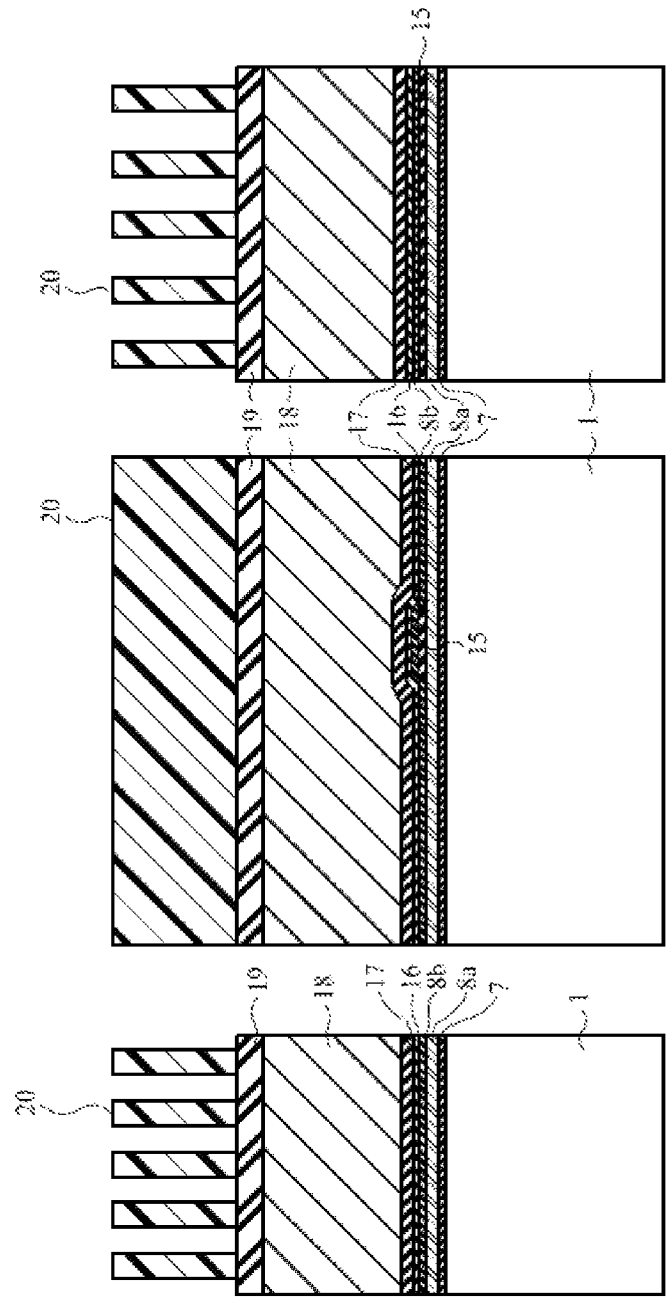

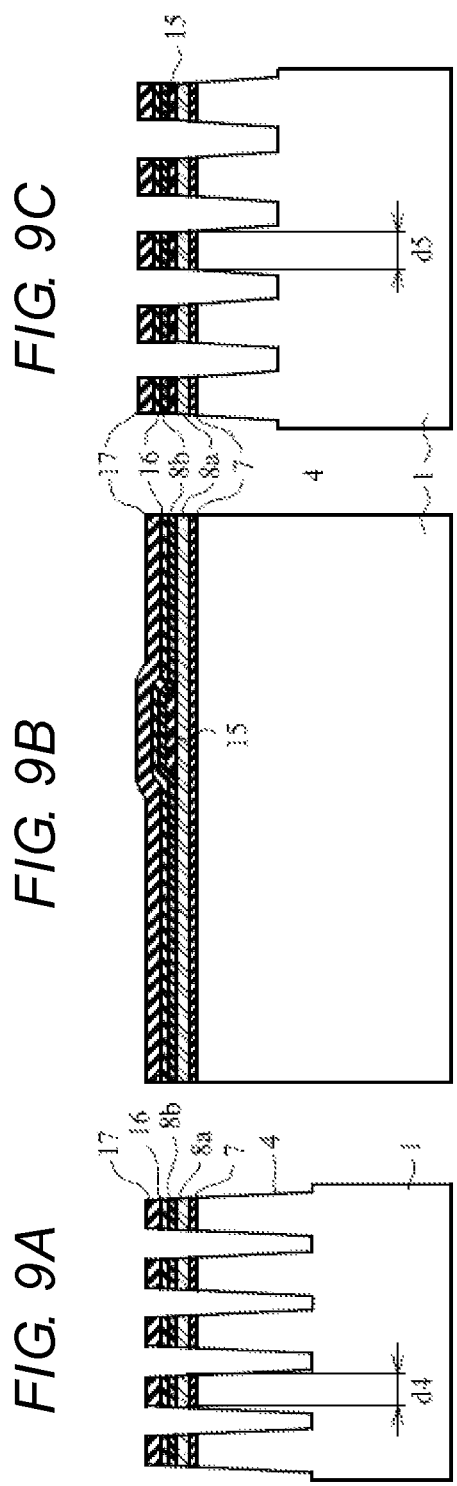

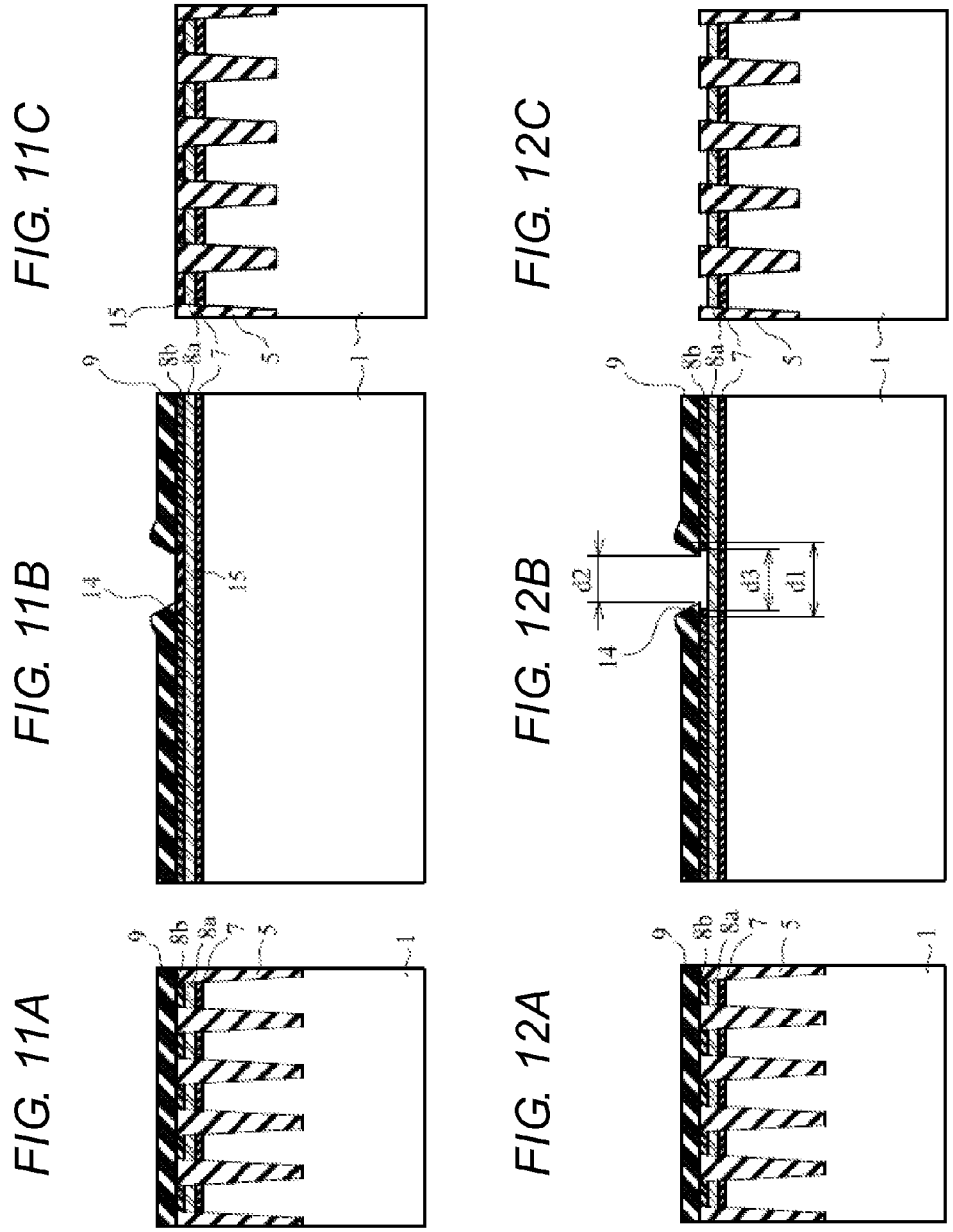

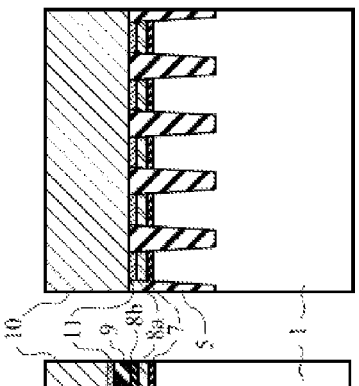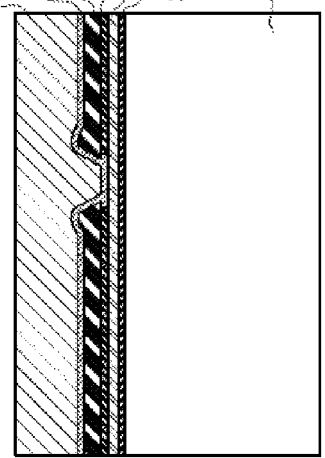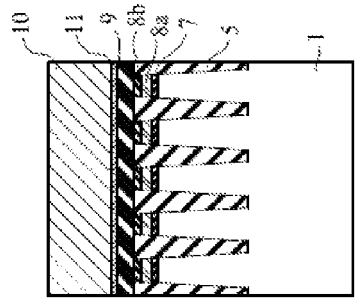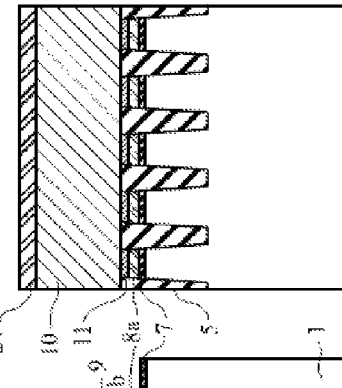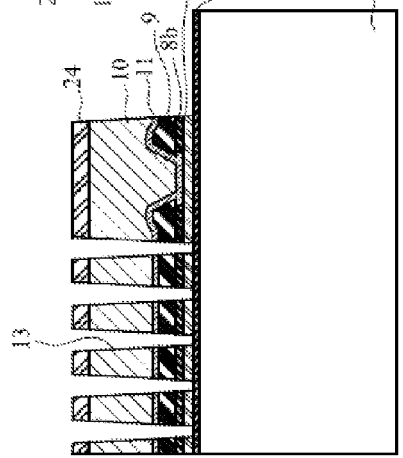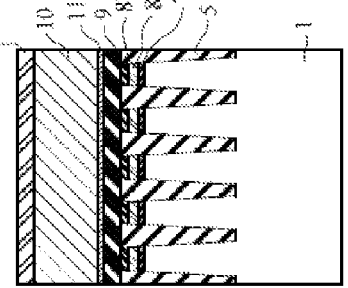

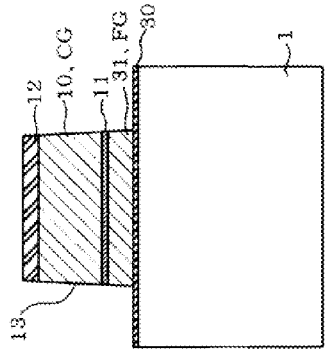
FIG. 15B
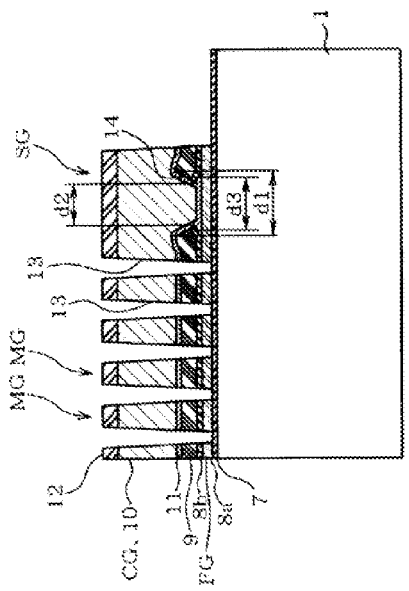
FIG. 15A
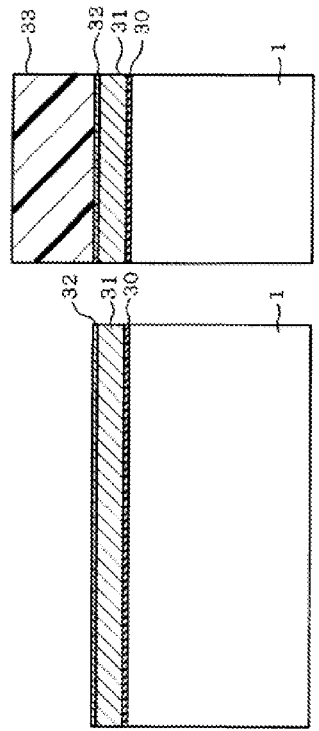
FIG. 16C
FIG. 16B
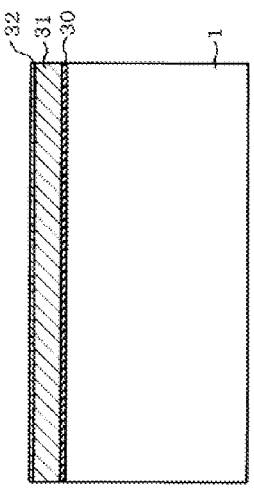
FIG. 16A

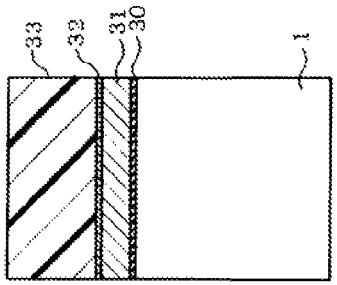
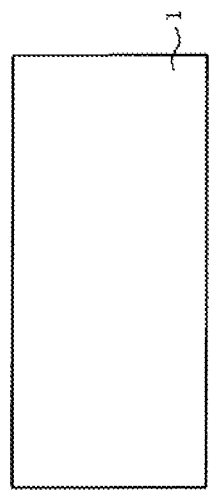
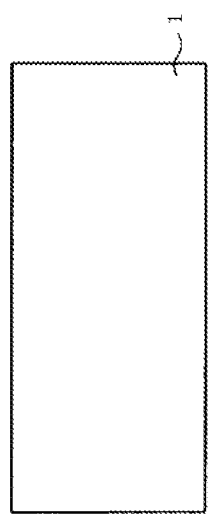
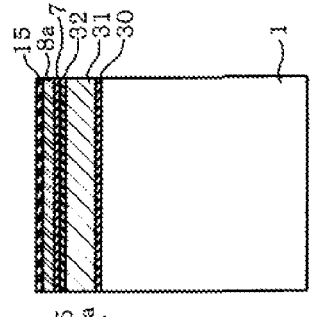
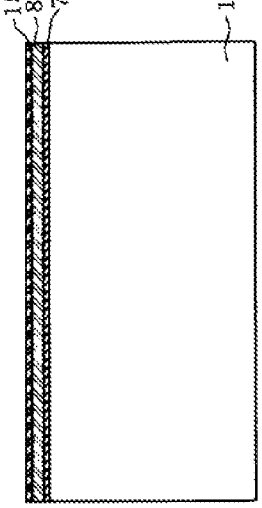
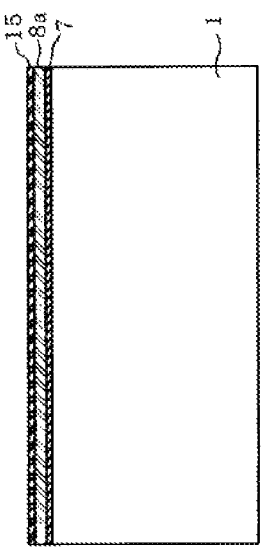

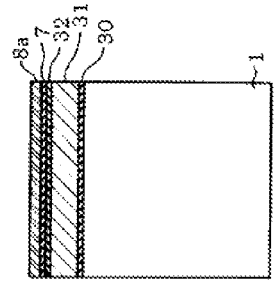
FIG. 19A  FIG. 19B  FIG. 19C
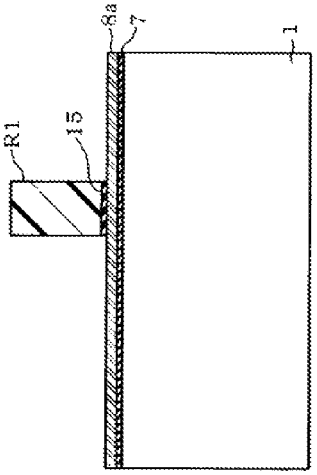
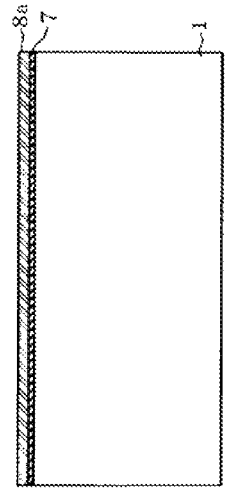
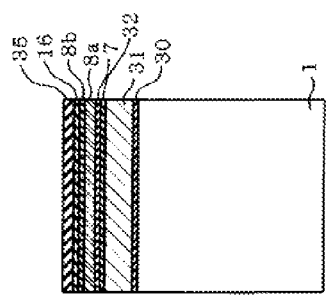
FIG. 20A  FIG. 20B  FIG. 20C
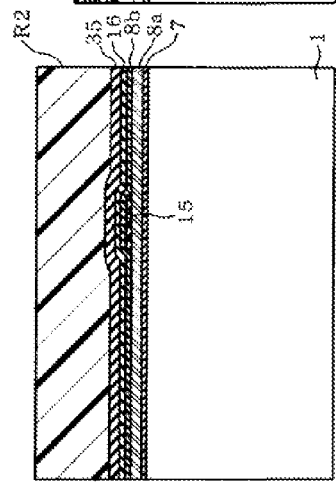
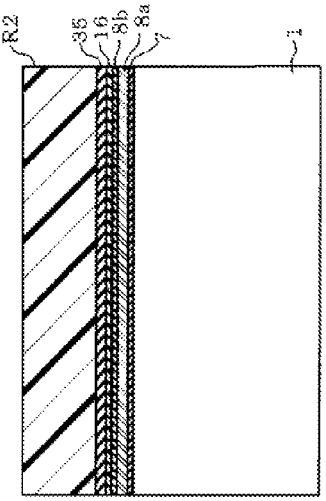

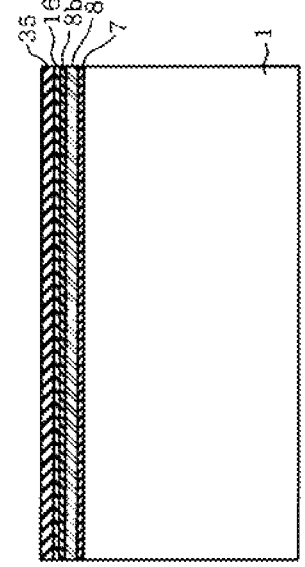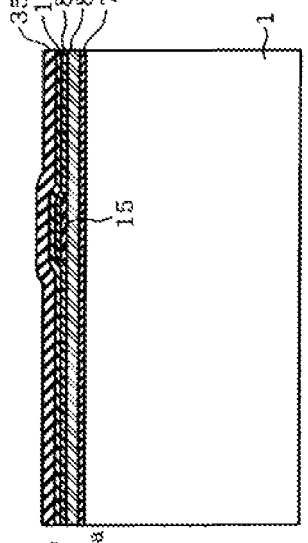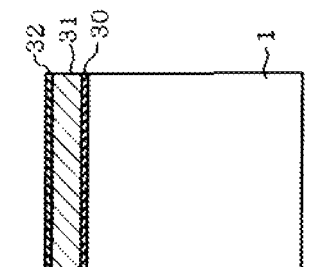

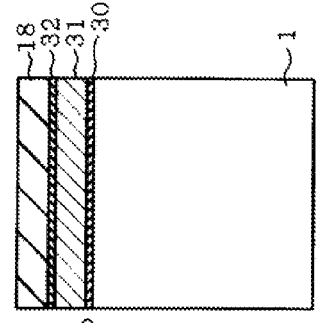
FIG. 23C
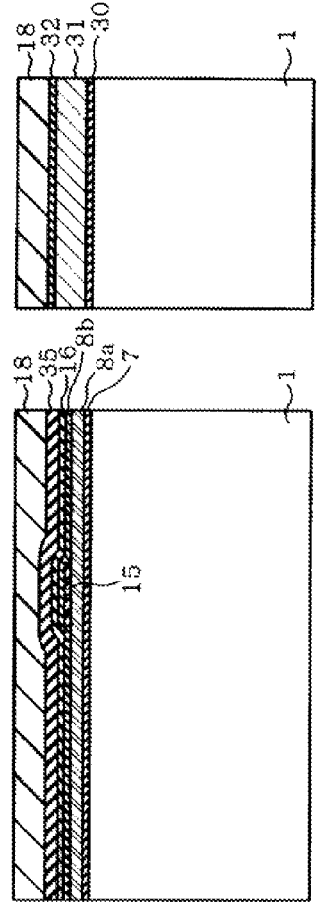
FIG. 23B
FIG. 23A
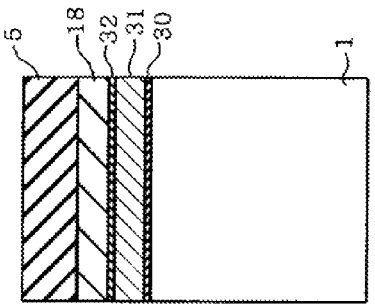
FIG. 24C
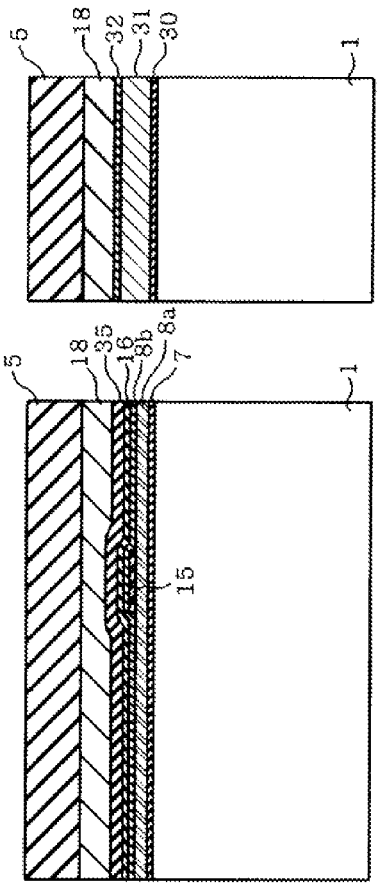
FIG. 24B
FIG. 24A

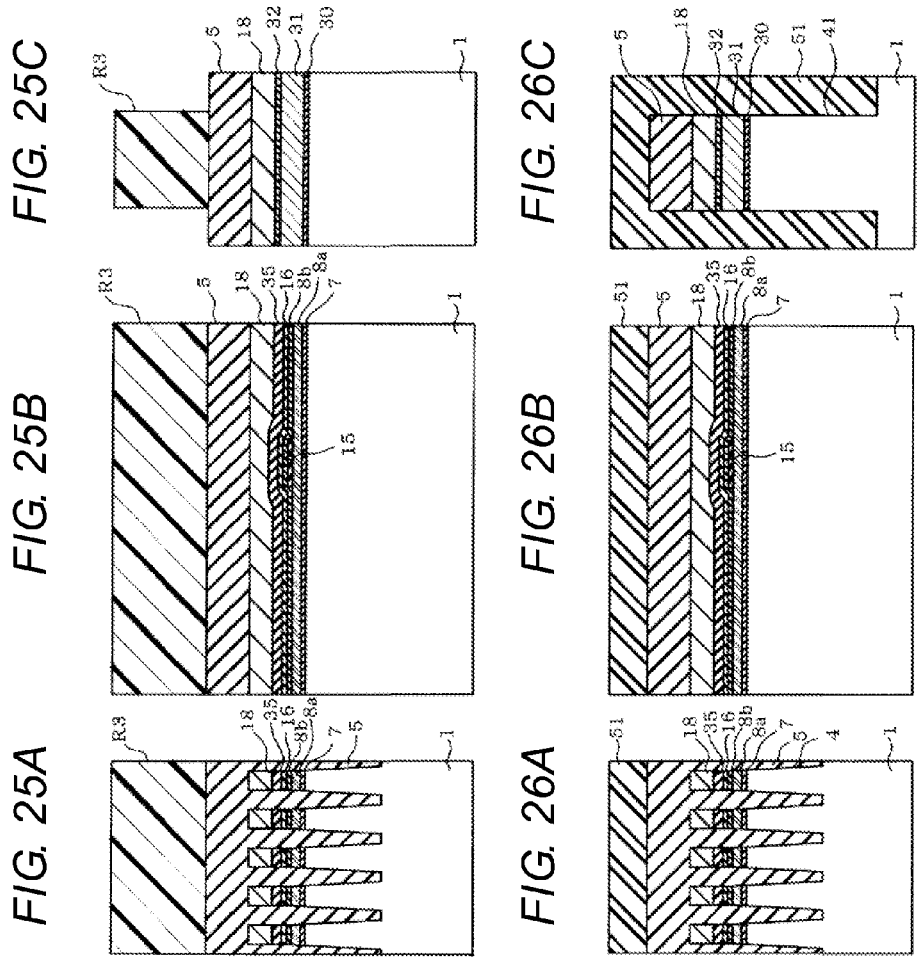

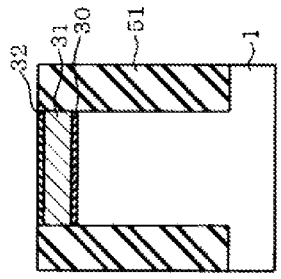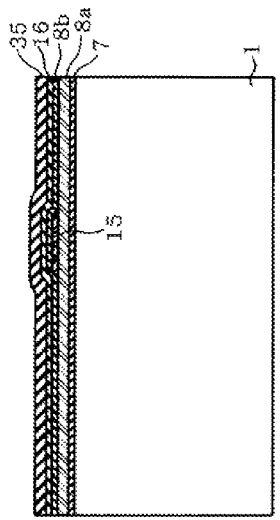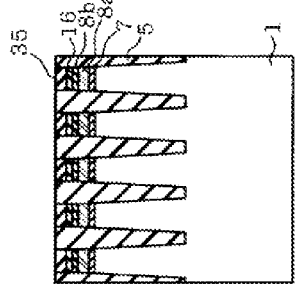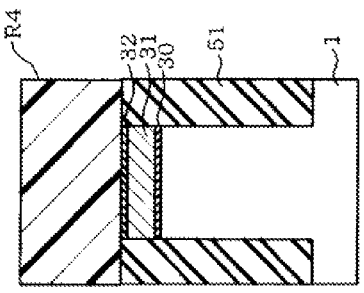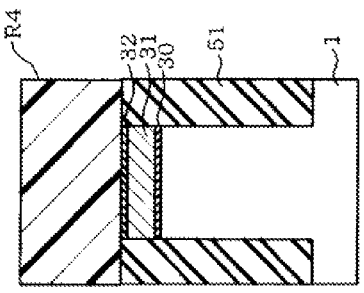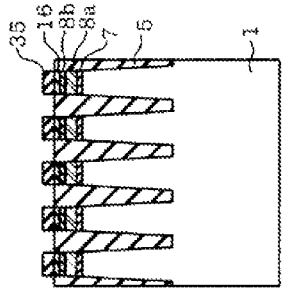

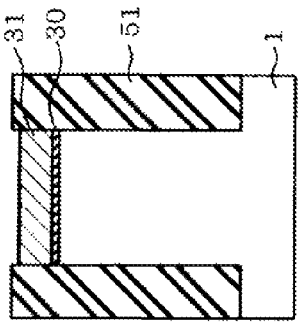
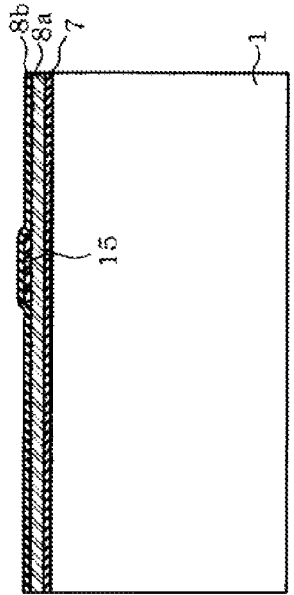
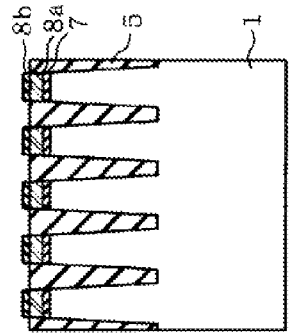
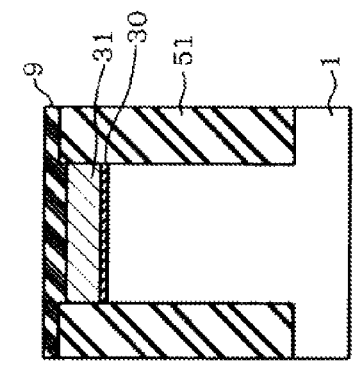
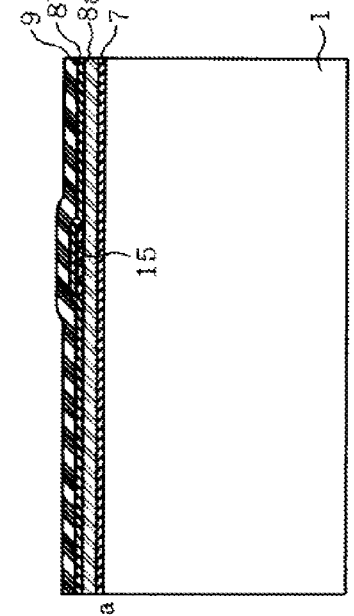
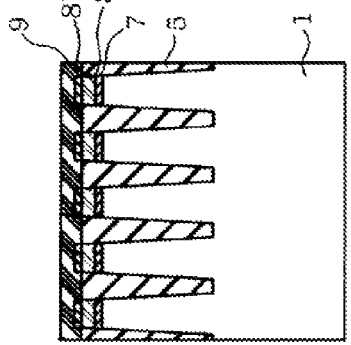

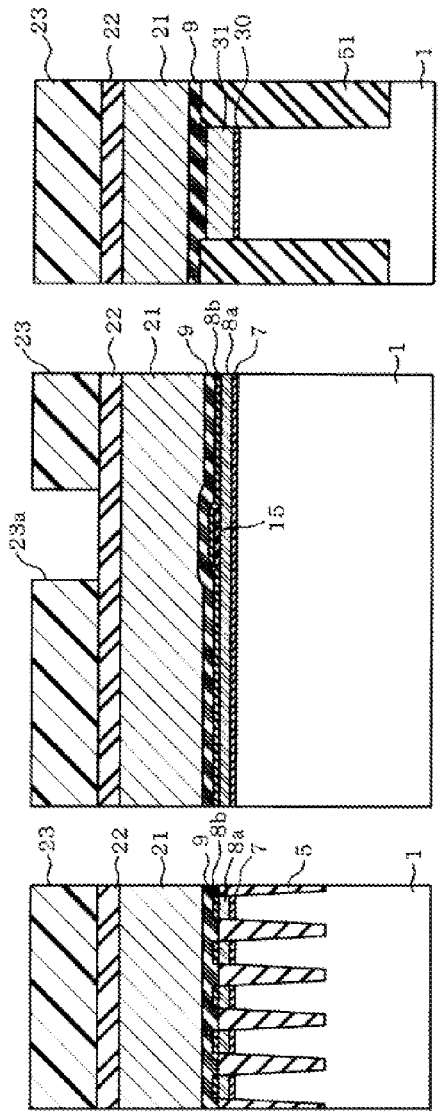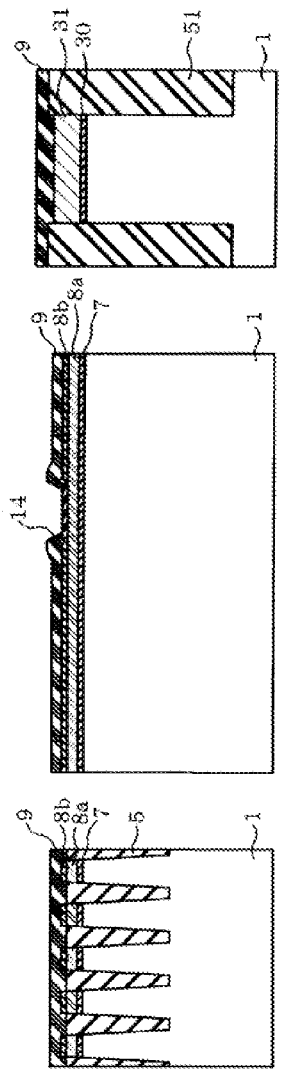

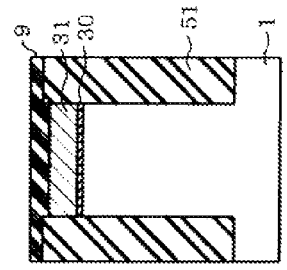
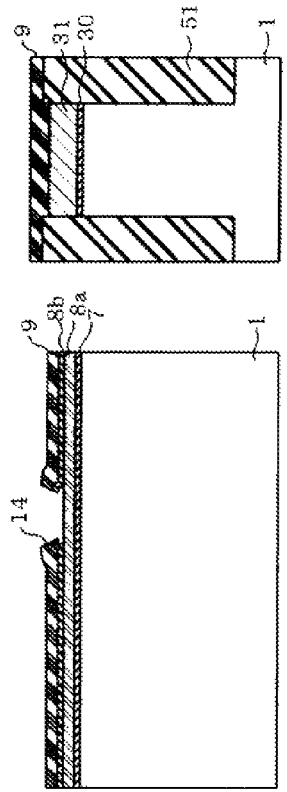
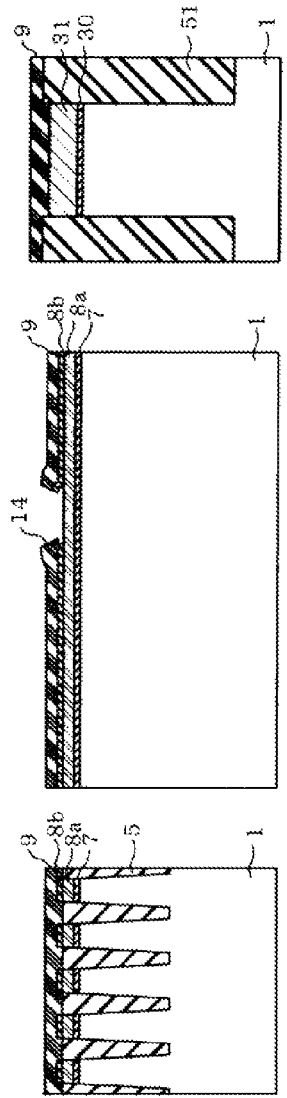
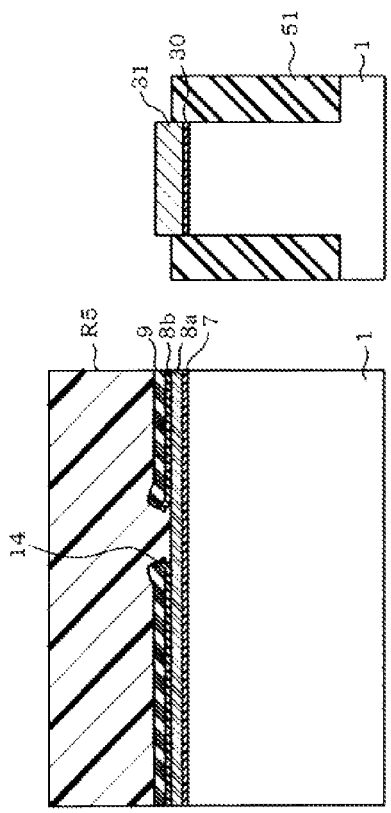
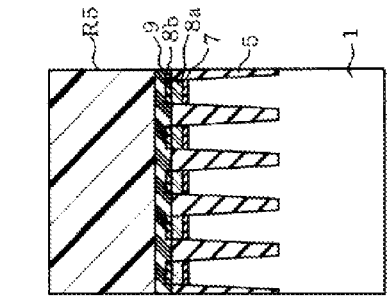

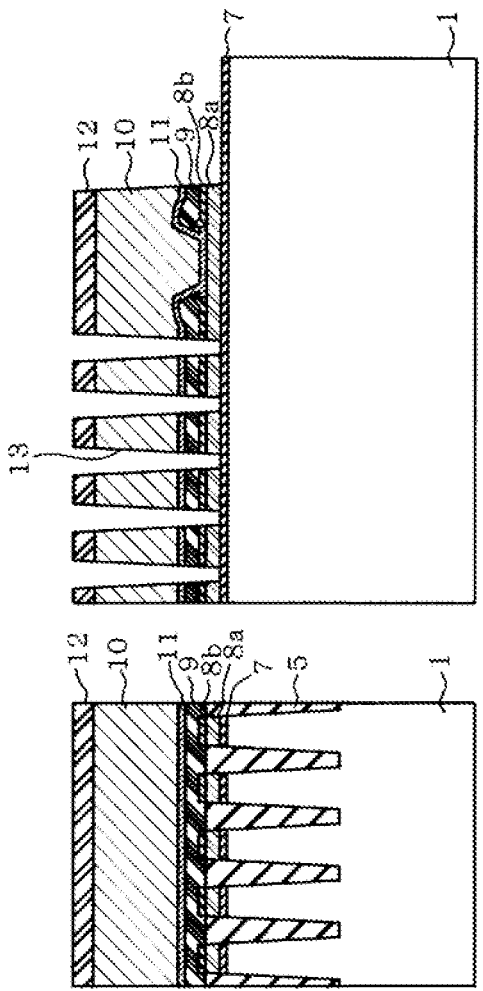

SEMICONDUCTOR DEVICE

CROSS-REFERENCE TO RELATED APPLICATION

This application is based upon and claims the benefit of priority from Japanese Patent Application No. 2013-060158, filed Mar. 22, 2013, the entire contents of which are incorporated herein by reference.

FIELD

The embodiment described herein relates to a semiconductor device.

BACKGROUND

In nonvolatile semiconductor memory devices, especially NAND-type flash memory devices, because the memory cells have a high aspect ratio, and the gate lengths continue to shrink, a pattern breakdown or misalignment may occur when a gate is formed. In one approach to solve these problems, an NAND-type flash memory device with a flat cell structure, in which a stack of a thin polysilicon film layer (hereinafter referred to as FG poly electrode) and a trap film layer comprised of SiN or HfO are used as a floating gate electrode and a high dielectric film is used as an IPD (Inter Poly Dielectric) film is employed. In the configuration of this flat cell structure, a capacitance of the high dielectric film can be high while maintaining a low aspect ratio, and thus the design has a good write/erasure characteristic.

Here, since the film thickness of the FG poly electrode is reduced, a structure for reliably interconnecting the control gate of a transistor and the FG poly electrode, and a method of reliably manufacturing the structure are needed.

DESCRIPTION OF THE DRAWINGS

FIG. 3A shows an example of a schematic cross-sectional view along the A-A line of FIG. 2A, FIG. 3B shows an example of a schematic cross-sectional view along the B-B line of FIG. 2A.

FIG. 5A shows an example (1) of a cross-sectional view along the B-B line of FIG. 2A in the manufacturing process, FIG. 5B shows an example (1) of a cross-sectional view along the A-A line of FIG. 2A in the manufacturing process, and FIG. 5C shows an example (1) of a cross-sectional view along the C-C line of FIG. 2A in the manufacturing process.

FIG. 6A shows an example (2) of a cross-sectional view along the B-B line of FIG. 2A in the manufacturing process, FIG. 6B shows an example (2) of a cross-sectional view along the A-A line of FIG. 2A in the manufacturing process, and FIG. 6C shows an example (2) of a cross-sectional view along the C-C line of FIG. 2A in the manufacturing process.

FIG. 7A shows an example (3) of a cross-sectional view along the B-B line of FIG. 2A in the manufacturing process, FIG. 7B shows an example (3) of a cross-sectional view along the A-A line of FIG. 2A in the manufacturing process, and FIG. 7C shows an example (3) of a cross-sectional view along the C-C line of FIG. 2A in the manufacturing process.

FIG. 8A shows an example (4) of a cross-sectional view along the B-B line of FIG. 2A in the manufacturing process, FIG. 8B shows an example (4) of a cross-sectional view along the A-A line of FIG. 2A in the manufacturing process, and FIG. 8C shows an example (4) of a cross-sectional view along the C-C line of FIG. 2A in the manufacturing process.

FIG. 9A shows an example (5) of a cross-sectional view along the B-B line of FIG. 2A in the manufacturing process, FIG. 9B shows an example (5) of a cross-sectional view along the A-A line of FIG. 2A in the manufacturing process, and FIG. 9C shows an example (5) of a cross-sectional view along the C-C line of FIG. 2A in the manufacturing process.

FIG. 11A shows an example (7) of a cross-sectional view along the B-B line of FIG. 2A in the manufacturing process, FIG. 11B shows an example (7) of a cross-sectional view along the A-A line of FIG. 2A in the manufacturing process, and FIG. 11C shows an example (7) of a cross-sectional view along the C-C line of FIG. 2A in the manufacturing process.

FIG. 12A shows an example (8) of a cross-sectional view along the B-B line of FIG. 2A in the manufacturing process, FIG. 12B shows an example (8) of a cross-sectional view along the A-A line of FIG. 2A in the manufacturing process, and FIG. 12C shows an example (8) of a cross-sectional view along the C-C line of FIG. 2A in the manufacturing process.

FIG. 13A shows an example (9) of a cross-sectional view along the B-B line of FIG. 2A in the manufacturing process, FIG. 13B shows an example (9) of a cross-sectional view along the A-A line of FIG. 2A in the manufacturing process, and FIG. 13C shows an example (9) of a cross-sectional view along the C-C line of FIG. 2A in the manufacturing process.

FIG. 14A shows an example (10) of a cross-sectional view along the B-B line of FIG. 2A in the manufacturing process, FIG. 14B shows an example (10) of a cross-sectional view along the A-A line of FIG. 2A in the manufacturing process, and FIG. 14C shows an example (10) of a cross-sectional view along the C-C line of FIG. 2A in the manufacturing process.

FIG. 15A shows an example of a diagram of an NAND-type flash memory device of a second embodiment corresponding to FIG. 3A, and FIG. 15B shows an example of a diagram of the NAND-type flash memory device of the second embodiment corresponding to FIG. 4.

FIG. 16A shows an example (1) of a cross-sectional view along the B-B line of FIG. 2A in the manufacturing process, FIG. 16B shows an example (1) of a cross-sectional view along the A-A line of FIG. 2A in the manufacturing process, and FIG. 16C shows an example (1) of a cross-sectional view illustrating an outlined configuration of a peripheral transistor in the manufacturing process.

FIG. 17A shows an example (2) of a cross-sectional view along the B-B line of FIG. 2A in the manufacturing process, FIG. 17B shows an example (2) of a cross-sectional view along the A-A line of FIG. 2A in the manufacturing process, and FIG. 17C shows an example (1) of a cross-sectional view illustrating an outlined configuration of the peripheral transistor in the manufacturing process.

FIG. 18A shows an example (3) of a cross-sectional view along the B-B line of FIG. 2A in the manufacturing process, FIG. 18B shows an example (3) of a cross-sectional view along the A-A line of FIG. 2A in the manufacturing process, and FIG. 18C shows an example (3) of a cross-sectional view illustrating an outlined configuration of the peripheral transistor in the manufacturing process.

FIG. 19A shows an example (4) of a cross-sectional view along the B-B line of FIG. 2A in the manufacturing process, FIG. 19B shows an example (4) of a cross-sectional view along the A-A line of FIG. 2A in the manufacturing process, and FIG. 19C shows an example (4) of a cross-sectional view illustrating an outlined configuration of the peripheral transistor in the manufacturing process.

FIG. 20A shows an example (5) of a cross-sectional view along the B-B line of FIG. 2A in the manufacturing process, FIG. 20B shows an example (5) of a cross-sectional view along the A-A line of FIG. 2A in the manufacturing process, and FIG. 20C shows an example (5) of a cross-sectional process illustrating an outlined configuration of the peripheral transistor in the manufacturing process.

FIG. 21A shows an example (6) of a cross-sectional view along the B-B line of FIG. 2A in the manufacturing process, FIG. 21B shows an example (6) of a cross-sectional view along the A-A line of FIG. 2A in the manufacturing process, and FIG. 21C shows an example (6) of a cross-sectional view illustrating an outlined configuration of the peripheral transistor in the manufacture.

FIG. 23A shows an example (8) of a cross-sectional view along the B-B line of FIG. 2A in the manufacturing process, FIG. 23B shows an example (8) of a cross-sectional view along the A-A line of FIG. 2A in the manufacturing process, and FIG. 23C shows an example (8) of a cross-sectional view illustrating an outlined configuration of the peripheral transistor in the manufacturing process.

FIG. 24A shows an example (9) of a cross-sectional view along the B-B line of FIG. 2A in the manufacturing process, FIG. 24B shows an example (9) of a cross-sectional view along the A-A line of FIG. 2A in the manufacturing process, and FIG. 24C shows an example (9) of a cross-sectional view illustrating an outlined configuration of the peripheral transistor in the manufacture.

FIG. 25A shows an example (10) of a cross-sectional view along the B-B line of FIG. 2A in the manufacturing process, FIG. 25B shows an example (10) of a cross-sectional view along the A-A line of FIG. 2A in the manufacturing process, and FIG. 25C shows an example (10) of a cross-sectional view illustrating an outlined configuration of the peripheral transistor in the manufacturing process.

FIG. 26A shows an example (11) of a cross-sectional view along the B-B line of FIG. 2A in the manufacturing process, FIG. 26B shows an example (11) of a cross-sectional view along the A-A line of FIG. 2A in the manufacturing process, and FIG. 26C shows an example (11) of a cross-sectional view illustrating an outlined configuration of the peripheral transistor in the manufacturing process.

FIG. 27A shows an example (12) of a cross-sectional view along the B-B line of FIG. 2A in the manufacturing process, FIG. 27B shows an example (12) of a cross-sectional view along the A-A line of FIG. 2A in the manufacturing process, and FIG. 27C shows an example (12) of a cross-sectional view illustrating an outlined configuration of the peripheral transistor in the manufacturing process.

FIG. 28A shows an example (13) of a cross-sectional view along the B-B line of FIG. 2A in the manufacturing process, FIG. 28B shows an example (13) of a cross-sectional view along the A-A line of FIG. 2A in the manufacturing process, and FIG. 28C shows an example (13) of a cross-sectional view illustrating an outlined configuration of the peripheral transistor in the manufacturing process.

FIG. 29A shows an example (14) of a cross-sectional view along the B-B line of FIG. 2A in the manufacturing process, FIG. 29B shows an example (14) of a cross-sectional view along the A-A line of FIG. 2A in the manufacturing process, and FIG. 29C shows an example (14) of a cross-sectional view illustrating an outlined configuration of the peripheral transistor in the manufacturing process.

FIG. 30A shows an example (15) of a cross-sectional view along the B-B line of FIG. 2A in the manufacturing process, FIG. 30B shows an example (15) of a cross-sectional view along the A-A line of FIG. 2A in the manufacturing process, and FIG. 30C shows an example (15) of a cross-sectional view illustrating an outlined configuration of the peripheral transistor in the manufacturing process.

FIG. 31A shows an example (16) of a cross-sectional view along the B-B line of FIG. 2A in the manufacturing process, FIG. 31B shows an example (16) of a cross-sectional view along the A-A line of FIG. 2A in the manufacturing process, and FIG. 31C shows an example (16) of a cross-sectional view illustrating an outlined configuration of the peripheral transistor in the manufacturing process.

FIG. 32A shows an example (17) of a cross-sectional view along the B-B line of FIG. 2A in the manufacturing process, FIG. 32B shows an example (17) of a cross-sectional view along the A-A line of FIG. 2A in the manufacturing process, and FIG. 32C shows an example (17) of a cross-sectional view illustrating an outlined configuration of the peripheral transistor in the manufacturing process.

FIG. 33A shows an example (18) of a cross-sectional view along the B-B line of FIG. 2A in the manufacturing process, FIG. 33B shows an example (18) of a cross-sectional view along the A-A line of FIG. 2A in the manufacturing process, and FIG. 33C shows an example (18) of a cross-sectional view illustrating an outlined configuration of the peripheral transistor in the manufacturing process.

FIG. 34A shows an example (19) of a cross-sectional view along the B-B line of FIG. 2A in the manufacturing process, FIG. 34B shows an example (19) of a cross-sectional view along the A-A line of FIG. 2A in the manufacturing process, and FIG. 34C shows an example (19) of a cross-sectional view illustrating an outlined configuration of the peripheral transistor in the manufacturing process.

FIG. 37A shows an example (22) of a cross-sectional view along the B-B line of FIG. 2A in the manufacturing process, FIG. 37B shows an example (22) of a cross-sectional view along the A-A line of FIG. 2A in the manufacturing process, and FIG. 37C shows an example (22) of a cross-sectional view illustrating an outlined configuration of the peripheral transistor in the manufacturing process.

DETAILED DESCRIPTION

Embodiments provide a semiconductor device that can connect a control gate electrode and a FG poly electrode layer of a transistor, even if the FG poly electrode layer is thin.

In general, embodiments will be explained with reference to the drawings. Here, in each embodiment, the same symbols are given to substantially identical constituent parts, and redundant explanation thereof is omitted. However, the drawings are schematic, and the relationship between the thickness and the planar size, the ratio of the thickness of each layer, etc. in the Figures may be different from the actual values thereof.

The semiconductor device of this embodiment includes a semiconductor substrate and a memory cell transistor having a first gate insulating film on an active region in a memory cell region and a gate electrode in which a first charge storage layer, a first interelectrode insulating film, and a first control gate electrode film are formed one over the other. In addition, a transistor having a second gate insulating film on the active region in the memory cell region or peripheral circuit region is provided on the semiconductor substrate and has a gate electrode in which a second charge storage layer, a second interelectrode insulating film, and a second control gate electrode film are formed one over the other. Moreover, the first and second charge storage layers have a structure in which a polysilicon film and a trap film are formed one over the other. Through the trap film, a groove with a funnel shape is formed, and the second control gate electrode film and the polysilicon film of the second charge storage layer are interconnected via the groove.

First Embodiment

Figure 1:
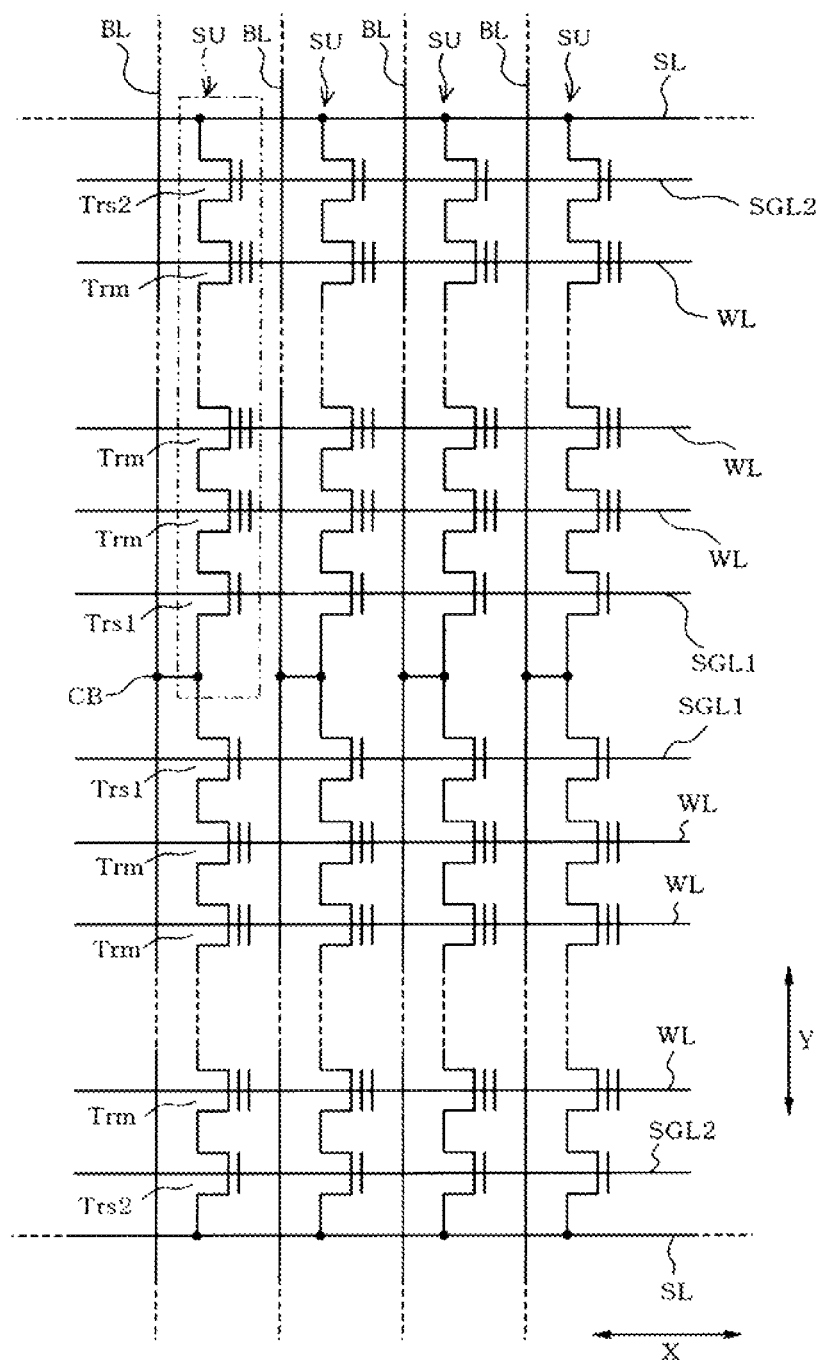
FIG. 1 shows an example of an equivalent circuit diagram illustrating part of a memory cell array of an NAND-type flash memory device of a first embodiment.

FIG. 1 is an equivalent circuit diagram illustrating part of a memory cell array that is formed in a memory cell region of an NAND-type flash memory device of a first embodiment. As shown in FIG. 1, the memory cell array of the NAND-type flash memory device is constituted by forming NAND cell units SU, each of which include two selector gate transistors Trs1 and Trs2 and multiple (for example, 32 but only 3 shown) memory cell transistors Trm connected in series between the selector gate transistors Trs1 and Trs2, in a matrix i.e., array, form. In the NAND cell units SU, multiple adjacent memory cell transistors Trm have common source/drain regions.

The memory cell transistors Trm arranged in the X direction (corresponding to the word line direction and the gate width direction) are commonly connected to word lines WL. In addition, the selector gate transistors Trs1 arranged in the X direction in FIG. 1 are commonly connected to a selector gate line SGL1, and the selector gate transistors Trs2 are commonly connected to a selector gate line SGL2. A bit line contact CB is also connected to a drain region of the selector gate transistor Trs1. The bit line contact CB is connected to bit lines BL extending in the Y direction (corresponding to the gate length direction and the bit line direction) orthogonal to the X direction in FIG. 1. Moreover, the selector gate transistor Trs2 is connected to a source line SL extending in the X direction of FIG. 1 at the source side thereof.

Figure 2A:
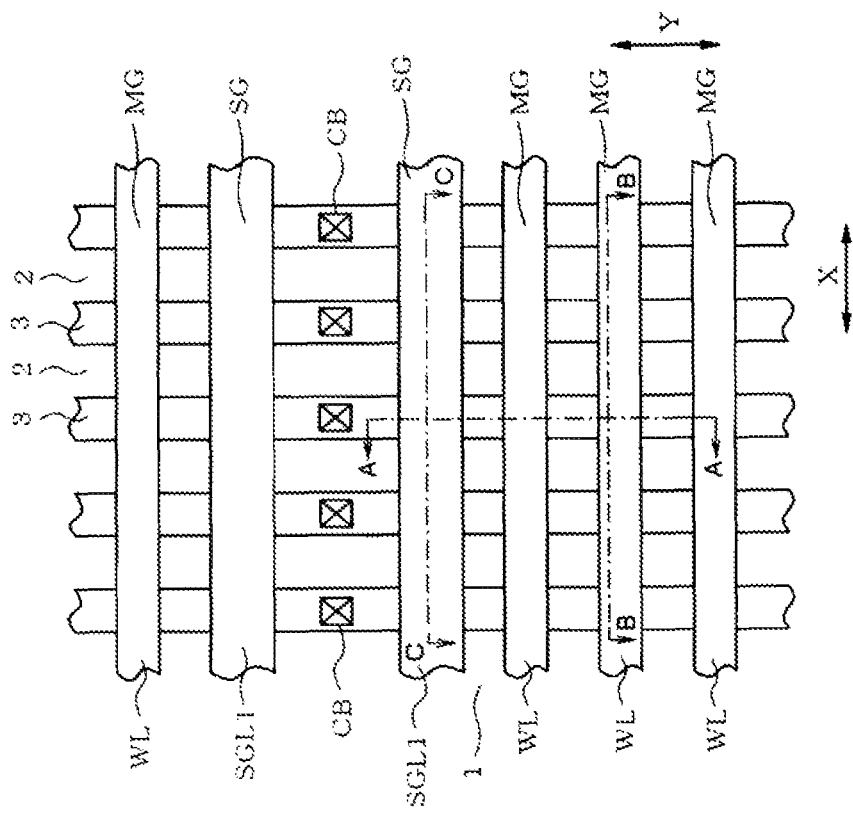
FIG. 2A shows an example of a schematic plan view illustrating a layout pattern of part of a memory cell region.

FIG. 2A is a plan view illustrating a layout pattern of part of a memory cell region. On a silicon substrate 1 as a semiconductor substrate, multiple shallow trench isolation structures 2 (STI) as element isolation regions are formed at a prescribed interval in the X direction of FIG. 2 and also extend in the Y direction of FIG. 2. Active regions 3, also extending in the Y direction of FIG. 2, are formed between adjacent STI region, and also extend and are spaced in the X direction of FIG. 2. The word lines WL connecting to the memory cell transistors Trm are formed so that the word lines extend in the direction (the X direction in FIG. 2A) orthogonal to the active regions 3, and multiple such word lines are formed at a prescribed interval in the Y direction of FIG. 2A.

In addition, selector gate lines SGL1 of a pair of selector gate transistors are formed so that the selector gate lines are formed to extend in the X direction of FIG. 2A. The bit line contacts CB are respectively formed in the active regions 3 between a pair of selector gate lines SGL1. Gate electrodes MG of the memory cell transistors are formed on the active regions 3 intersecting with the word lines WL, and gate electrodes SG of the selector gate transistors are formed on the active regions 3 intersecting with the selector gate lines SGL1.

Figure 2B:
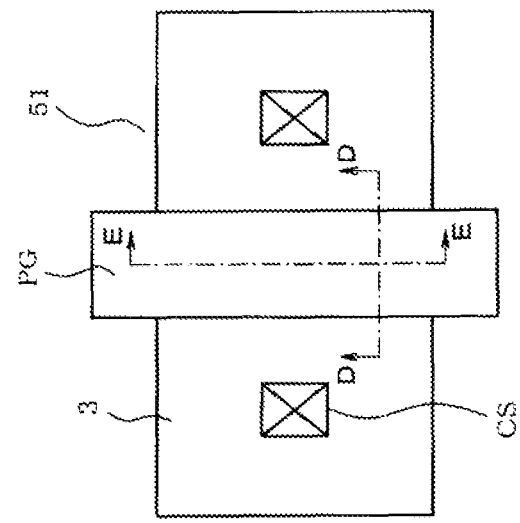
FIG. 2B is an example of a schematic plan view illustrating a layout pattern of part of a peripheral circuit region.

FIG. 2B is a plan view illustrating a layout pattern of part of a peripheral circuit region. The active region 3 is enclosed with an element isolation region 51 such as a surrounding STI structure. A gate electrode PG extends up to the element isolation region 51 from the active region 3. Contacts CS are formed to either side of the gate electrode PG.

Figure 3C:
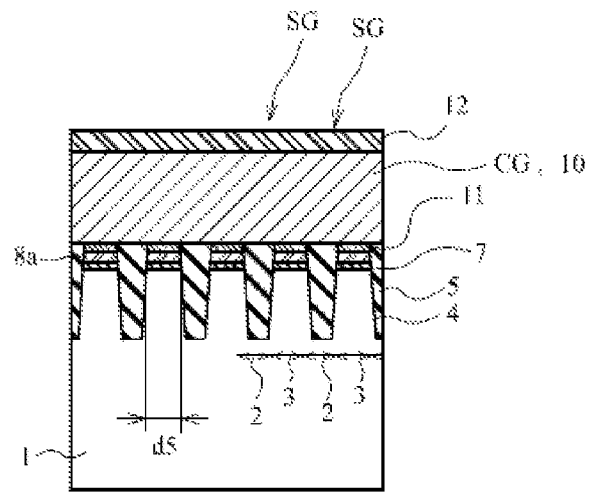
FIG. 3C shows an example of a schematic cross-sectional view along the C-C line of FIG. 2A.
Figure 4:
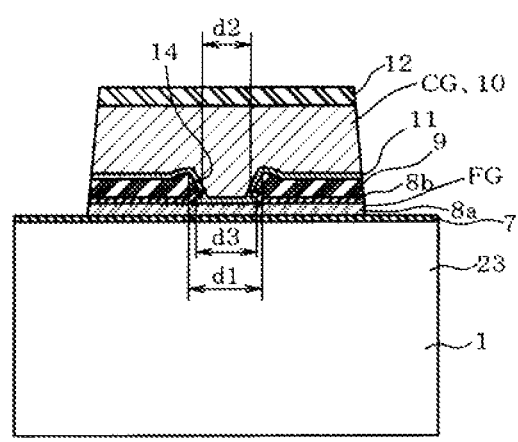
FIG. 4 shows an example of a schematic cross-sectional view illustrating an outlined configuration of a peripheral transistor.

Next, a gate electrode structure in the memory cell region of this embodiment will be explained with reference to FIGS. 3A to 3C, and a gate electrode structure in the peripheral circuit region will be explained with reference to FIG. 4. FIG. 3A schematically shows a cross-sectional view along the A-A line (the bit line direction, Y direction) of FIG. 2A, FIG. 3B schematically shows a cross-sectional view along the B-B line (the word line direction, X direction) of FIG. 2A, and FIG. 3C schematically shows a cross-sectional view along the C-C line (the word line direction, X direction) of FIG. 2A. FIG. 4 schematically shows a cross-sectional view along the D-D line of FIG. 2B.

In FIG. 3A and FIG. 3B showing the gate electrode structure of the memory cell region, multiple element isolation trenches 4 (FIG. 3B) are formed or extend into the upper part of the silicon substrate 1 and are spaced from one another in the X direction. These element isolation grooves 4 isolate active regions 3 in the substrate 1 in the X direction of FIG. 3B. In the element isolation groove 4, an element isolation insulating film 5 is formed, to form an element isolation region (STI) 2.

The memory cell transistor comprises an n-type diffusion layer (not shown) formed on the silicon substrate 1, a tunnel oxide film (a gate insulating film) 7 formed on the silicon substrate 1, and a gate electrode structure MG installed on the tunnel oxide film 7. The gate electrode structure MG is a gate electrode with a flat gate structure and includes a floating gate electrode FG as a charge storage layer, an IPD film (an interelectrode insulating film) 9 formed on the floating gate electrode FG, and a control gate electrode CG formed on the IPD film 9. Diffusion layers are formed on either side of the gate electrode MG of the memory cell transistor, in the surface layer of the silicon substrate 1, and they constitute the source and drain regions of the memory cell transistor.

The tunnel oxide film 7 is formed on the silicon substrate 1 (active region 3). For example, a silicon oxide film is used. The thickness of the tunnel oxide film 7, for example, is about to 8 nm. The floating gate electrode FG uses a polycrystalline silicon film doped with impurities such as phosphorus (hereinafter, referred to FG polysilicon film) 8a and a charge trap film 8b comprised of SiN or HfO, for instance, formed on the FG polysilicon film 8a. The thickness of the FG polysilicon film 8a and the trap film 8b, for example, is 10 nm or less.

The IPD film 9 is formed along the upper surface of the element isolation insulating film 5 and the upper surface of the floating gate electrode FG and functions as an interelectrode insulating film, i.e., as an insulating film between the conductive layers, and as an interelectrode insulating film. For the IPD film 9 material, a high dielectric constant material, for example, a monolayer film or a multilayer film of SiN, $SiO_2$, HfO, or AlO, is used. The control gate electrode CG comprises a conductive layer 10 functioning as the word line WL for one string or line of the memory cell transistors shown in FIG. 1. The conductive layer 10, for example, may be a tungsten layer or a polycrystalline silicon layer doped with impurities such as phosphorus or a silicide layer or a multi-layered structure comprising a polycrystalline silicon layer and the silicide layer. Here, a barrier metal 11 of WN, Ti/TiN, TaN, etc. for instance, is formed between the conductive layer 10 and the IPD film 9. On the upper surface of the conductive film 10, for example, a capping film 12 using SiN, etc. is formed.

As shown in FIG. 3A, the gate electrodes MG of the memory cell transistor are positioned in parallel across the face of the substrate, and electric separation is created between the respective gate electrodes MG, and between the gate electrode MG of the memory cell transistor and the gate electrode SG of the selector gate transistor, by grooves 13 extending therebetween. Within the grooves 13, for example, a silicon oxide film formed using TEOS (tetraethyl orthosilicate), or a different insulating film (not shown) between the memory cells using a low-dielectric insulating film is formed. On the insulating film between the memory cells and on the control gate electrode CG, for example, an interlayer dielectric (not shown) comprised of a silicon oxide film is formed.

In addition, the multilayered structure of the gate electrode SG of the selector gate transistor is almost the same as the laminated structure of the gate electrode MG of the memory cell transistor, and the difference between these structures is that an EI groove 14 extends through the IPD film 9 and the charge trap film 8b. As the EI groove 14 filling material, the conductive layer 10 and the barrier metal 11 of the control gate electrode CG extend directly on the FG polysilicon film 8a of the floating gate electrode FG. In other words, the selector gate transistor is formed in a monolithic transistor structural pattern (that is, a monolayer gate structure). The shape of the EI groove 14 is configured so that the width d3 at the base of the groove, i.e., at the interface of the IPD film 9 and FG polysilicon film 8a is wider than the width d2 part of the groove, which is spaced from the polysilicon film 8a. Therefore, the contact area between the conductive layer 10 with the FG polysilicon film 8a (with intervening barrier metal 11) is increased to be larger than the minimum cross section of the EI groove 14.

Moreover, the IPD film 9 has an upward swollen shape at the sides of the EI groove 14. In other words, the EI groove 14 has one or more inflection points along the IPD film 9 (or the barrier metal 11). The opening width between the inflection points at the farthest position from the gate insulating film 7 can be set to the width d1. In addition, the size between the inflection points in which the EI groove is the narrowest is at an opening size d2. In this application example, the width of the EI groove 14 spaced slightly above the lower surface of the IPD film 9 is the opening size d2. Here, the opening size d1 is greater than the opening size d2, and the EI groove 14 is thus undercut in the IPD film 9.

The barrier metal 11 extends to the lower surface of the IPD film 9 at the bottom of the EI groove 14, and into the undercut portion of the groove, in the space in the IPD film extending between dimension d2 and dimension d3. If the width in the trap film 8b at the bottom of the EI groove 14 is assumed to be an opening size d3, the opening size d3 is greater than the opening size d2, and the trap film 8b is undercut at the opening. As a result, the contact area of the barrier metal 8b (or the conductive layer 10) and the FG polysilicon film 8a is larger than the smallest cross section of the opening of the EI groove 14.

Furthermore, a width d5 (FIG. 3C) in the X direction (the channel width direction) of the FG polysilicon film 8a of the selector gate transistor is greater than a width d4 in the X direction (the channel width direction) of the FG polysilicon film 8a of the memory cell transistor. As a result, the contact area of the barrier metal 8b (or the conductive layer 10) and the FG polysilicon film 8a can be further increased.

As shown in FIG. 4, the gate electrode structure of a peripheral transistor in the peripheral circuit region is substantially the same as the multilayered structure of the gate electrode SG of the selector gate transistor. Specifically, the tunnel oxide film 7 (also referred to as a gate insulating film 7) is formed on an active region 23 of the silicon substrate 1, and the floating gate electrode FG (the FG polysilicon film 8a and the trap film 8b) comprised of the gate electrode, the IPD film 9, the barrier metal 11, the control gate electrode CG (the conductive layer 10), and the cap film 12 are sequentially provided on the tunnel oxide film 7 similarly to the selector gate transistor.

Next, the EI groove 14 is formed in the IPD film 9 and the trap film 8b so that the EI groove extends through these films, allowing the barrier metal 11 and the conductive layer 10 formed thereover to contact the FG polysilicon film 8a of the floating gate electrode FG. In other words, the peripheral transistor of the peripheral circuit region is formed in a monolithic transistor structural (that is, a monolayer gate structure) pattern. In addition, the shape of the EI groove 14 is configured so that the width d11 of the opening part through the IPD film 9 is wider than the width d2 at the base part of the opening, where the FG polysilicon 8a is exposed, with a minimum opening width slightly above than the bottom of the groove. Therefore, the contact area of the conductive layer 10 and the FG polysilicon film 8a is increased.

The opening shape of the EI groove 14 is almost the same as the shape of the groove at the selector gate transistor. The opening width between the inflection points at the farthest position from the gate insulating film 7 can be set to the width d1. In addition, the width of the EI groove 14 at the lower surface of the IPD film 9 can be set to the opening size d2. Here, the opening size d1 is greater than the opening size d2.

Moreover, if the gap in the trap film 8b at the bottom of the EI groove 14 is assumed as an opening size d3, the opening size d3 is greater than the opening size d2. As a result, the contact area of the barrier metal 11 (or the conductive layer 10 thereover) and the FG polysilicon film 8a can be increased.

The thickness of the tunnel oxide film 7 of the transistor of the peripheral circuit region may be almost the same thickness of the tunnel oxide film 7 of the memory cell transistor; when the transistor of the peripheral circuit region is a transistor with a high breakdown voltage, a tunnel oxide film for a transistor with a high breakdown voltage with a thickness greater than the thickness of the tunnel oxide film 7 of the memory cell transistor may be formed as the tunnel oxide film.

Next, an example of the method for manufacturing the NAND-type flash memory device of this embodiment will be explained with reference to the steps in the cross sectional views shown in FIGS. 5A to 14C. FIGS. 5A to 14A schematically show the manufacturing steps of a cross-sectional structure of the memory cell region corresponding to FIG. 3B. FIGS. 5B to 14B schematically show the manufacturing steps of a cross-sectional structure of the memory cell region corresponding to FIG. 3A. FIGS. 5C to 14C schematically show the manufacturing steps of a cross-sectional structure (that is, a cross-sectional structure along the D-D line of FIG. 6B, etc.) along the C-C line of FIG. 2A.

As shown in FIGS. 5A to 5C, a silicon oxide film is first formed as the tunnel oxide film 7 on the surface of the silicon substrate 1 by a thermal oxidation method, for instance. The thickness of the tunnel oxide film 7 is, for example, about 5 to 8 nm. The tunnel oxide film 7 functions as the tunnel oxide film (a gate insulating film) of the memory cell transistors and the selector gate transistors. In addition, where a transistor with a high breakdown voltage is formed in the peripheral circuit region, for example, the silicon oxide film is formed by a well-known method as a tunnel oxide film with a thickness greater than the thickness of the tunnel oxide film 7 of the memory cell transistor.

Next, the FG polysilicon film 8a is formed on the tunnel oxide film 7 by a CVD (chemical vapor deposition) or other deposition method. The thickness of the FG polysilicon film 8a, for example, is about 10 nm or less. Then, a highly selective hard mask 15 layer used as an etch stop layer during RIE of the EI groove 14 is formed on the FG polysilicon film 8a. The thickness of the highly selective hard mask 15, for example, is set to a thickness of about 5 to 10 nm or at a maximum of 20 nm. The reason for the film thickness being a maximum of 20 nm is that a step formed near a position of the EI groove 14 after processing according to FIGS. 6A-6C is small. For the material of the highly selective hard mark 15, a material with a high RIE selection ratio and WET selection ratio with (a low etch rate in comparison to) polysilicon, silicon oxide, silicon nitride, and photo resist materials is preferable. Specifically, AlN (aluminum nitride film), $Al_2O_3$ (aluminum oxide film), TiO (titanium oxide film), etc. are preferable.

Next, a photoresist R1 is spread on the highly selective hard mask 15, and the resist material is patterned by exposure and development. Specifically, patterning of the resists and etching of the hard mask layer 15 is carried out so that the highly selective hard mask 15 is left in place where the EI groove 14 (the EI contact) is to be formed (see FIGS. 6A to 6C). Using the resist R1 as a mask, the highly selective hard mask 15 portion not covered by the resist R1 is etched by WET etching, for instance. Therefore, a configuration shown in FIGS. 6B and 6C is obtained. As a WET etch fluid, an etch fluid with a high selection ratio to the hard mask as compared with polysilicon, silicon oxide film, and a resist material is preferable so that the tunnel oxide film 7 and the very thin FG polysilicon film 8a is not etched. As the WET etch fluid, for example, APM (ammonia peroxide mixture), etc. can be used. The resist R1 is removed, such as by traditional ashing, after the mask layer 15 is etched.

As shown in FIGS. 7A to 7C, the trap film 8b with a thickness of about 10 nm or less, for instance, is formed on the FG polysilicon film 8a and the remaining portion of the highly selective hard mask 15. As the material of the trap film 8b, SiN, HfO, etc. are preferable. Next, as hard masks used in the step of forming the element isolation groove 4, for example, a silicon oxide film 16 and an amorphous silicon film 17 are formed on the trap film 8b. Therefore, a configuration shown in FIGS. 7A to 7C can be obtained. In addition, as masks used for forming the element isolation groove 4, for example, an organic carbon group film 18 and an antireflection film 19 using SiON are formed on the amorphous silicon film 17 (see FIGS. 8A to 8C). Here, a step (a projecting feature such as a slight mesa) is sometimes formed in the trap film 8, the silicon oxide film 16, and the amorphous silicon film 17 in the area where the EI groove 14 is formed. However, since the film thickness of the highly selective hard mask 15 is thin, the upper surface of the organic carbon group film 18 and the antireflection film 19 is nearly planar.

Next, as shown in FIG. 8, a photoresist 20 is spread on the antireflection film 19, and the resist 20 is patterned by exposure and development. Specifically, patterning is carried out so that a mask pattern for forming the element isolation grooves 4 is formed. As a result, the configuration shown in FIG. 8 is obtained.

As shown in FIGS. 9A to 9C, the element isolation grooves 4 are formed in substrate 1 using a RIE method, for instance. In this case, the hard mask 15 is easily changed into a tapered shape by etching, in particular by the RIE method because a reaction product of the RIE method can be readily introduced onto a side surface of the hard mask 15 when a metal type hard mask is used as the hard mask 15. As a result, the width d5 of the active region 3 of the selective gate transistor part is widened, as compared with the width d4 (the width in the word line direction, for example, being about 10 nm) of the active region 3 of the memory cell part; the depth of the element isolation groove 4 of the selector gate transistor part tends to shallow, as compared with the depth (for example, about 110 to 180 nm) of the element isolation groove 4 of the memory cell part (see FIGS. 9A and C). Specifically, the width of the active region 3, for example, is widened by about 2 nm or more, and the depth of the element isolation groove 4, for example, is shallower by about 30 nm or more.

Figure 10C:
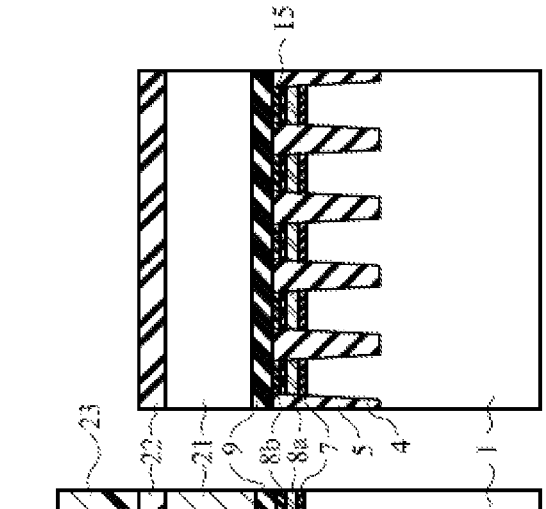
FIG. 10C shows an example (6) of a cross-sectional view along the C-C line of FIG. 2A in the manufacturing process.
Figure 10B:
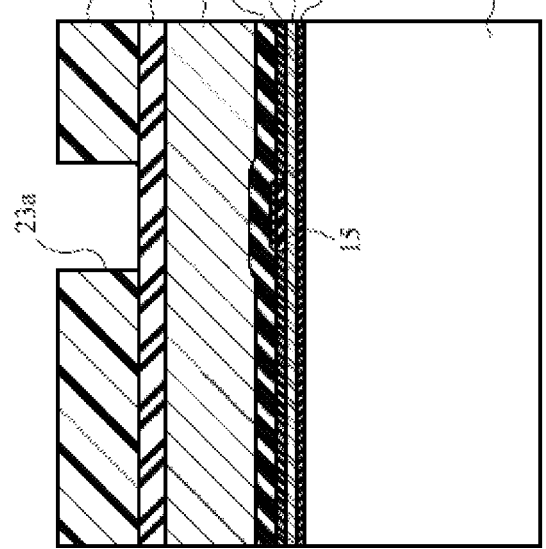
FIG. 10B shows an example (6) of a cross-sectional view along the A-A line of FIG. 2A in the manufacturing process.
Figure 10A:
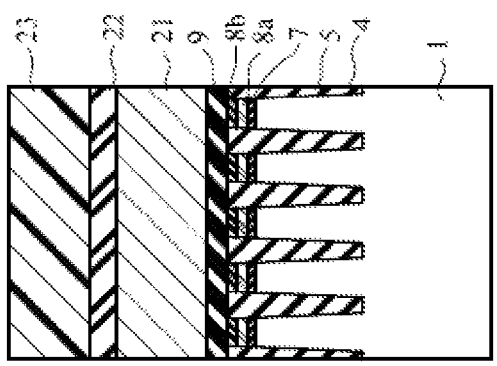
FIG. 10A shows an example (6) of a cross-sectional view along the B-B line of FIG. 2A in the manufacturing process.

Next, after removing the mask members (the silicon oxide film 16 and the amorphous silicon film 17), the element isolation insulating film 5 is deposited into the element isolation groove 4 by the CVD method, for instance, and flattened using CMP (chemical mechanical polish) (to result in the structure shown in FIG. 10). The IPD film 9 using SiN, $SiO_2$, HfO, AlO, etc. is then formed on the upper surface of the element isolation film 5 and the upper surface of the floating gate electrode FG (the trap film 8b) (see FIGS. 10A to 10C).

Next, a mask film 21 for forming the feature, EI, an antireflection film 22 using SiON, and a photoresist 23 are sequentially formed over the IPD film 9. Here, a protrusion or mesa remains in the IPD film 9 in the area where the EI groove 14 is formed, over the hard mask 15. However, since the film thickness of the highly selective hard mask 15 is thin, the upper surface of the antireflection film 22 and the photoresist 23 is nearly planar. As the material of the mask film 21 for forming the EI feature, $SiO_2$, coating carbon, amorphous carbon, etc. are preferably used (see FIG. 10). The resist 23 is then patterned by exposure and development. Specifically, patterning is carried out so that a mask pattern for forming the EI feature is formed. In this case, an opening 23a in the resist 23 is formed so that the opening is disposed directly over the highly selective hard mask 15. Therefore, the structure shown in FIGS. 10A to 10C is obtained.

Next, as shown in FIGS. 11A to 11C, the EI groove 14 is formed in the IPD film 9 using the RIE method, for instance. In this case, etching is carried out under the condition in which the highly selective hard mask 15 underlying the etched feature is insignificantly etched. As a result, the IPD film 9 and the trap film 8b are etched away over the hard mask 15, and the etching is stopped by and on the selective hard mask 15 layer. Therefore, the EI groove 14 can be formed without etching the very thin FG polysilicon film 8a which elsewhere underlies the trap film 8b. Here, the width of the upper surface of the highly selective hard mask 15 exposed in the EI groove 14 is smaller than the width of the highly selector hard mask 15 in the width direction of the etch feature. The reason for this is that misalignment during the forming of the EI groove 14 is taken into account. As a result, the highly selective hard mask 15 has a structure in which the hard mask extends under the lower surface of the IPD film 9 at the bottom of the EI groove 14. For this reason, the upper surface of the IPD film 9 has a slight rise or mesa shape in the location where the hard mask 15 underlies the IPD film 9, and after etching through the IPD film 9 to land on the hard mask 15 the shape of the IPD film at the sides of the EI groove 14 is extended upward. Therefore, the configuration shown in FIG. 11 can be obtained.

As shown in FIGS. 12A to 12C, the selective hard mask 15 is no longer needed, an it is, for example, removed by WET etching. Though the selection ratio of hard mask material 15 etching rate to the rate of etching of the IPD layer 9 and the FG polysilicon film 8a is required similar to the previous step for etching the highly selective hard mask 15, since the selection ratio with respect the resist material is not required to be considered (the resist was previously stripped), SPM (sulfuric acid peroxide mixture), etc. as well as APM can also be used. Here, if the highly selective hard mask 15 is removed, the EI groove 14 with a tapered undercut shape, that is, the EI groove 14 with a shape (referred to as tapered and undercut shape) in which the width d3 of the bottom opening part is wider than the width d2 of an opening part with a minimum opening width slightly upper than the bottom (the width between the lower surfaces of the IPD film 9 is the opening size), is formed in a self-aligned fashion. In other words, the EI groove 14 has one or more inflection points along the IPD film 9, and the opening in the IPD film 9 is undercut. The opening width between the inflection points of the farthest position from the gate insulating film 7 can be set to the width d1. Here, the width d1 is greater than the width d2.

Next, a barrier metal 11 with a good embedding property is formed on the IPD film 9 and on the inner surface of the EI groove 14 (see FIGS. 13A to 13C). As the barrier metal 11, CVD-WN, CVD-Ti/TiN, ALD (Atomic Layer Deposition)-TaN, etc. can be used. On the barrier metal 11, for example, the conductive layer 10 using W is then formed, and the inside of the EI groove 14 is filled with W. Therefore, the control gate electrode GC and the EI contact are simultaneously formed, thus being able to obtain a configuration shown in FIG. 13A. The electrode material of the control gate electrode GC (the conductive layer 10), for example, combinations of materials such as polysilicon/W and polysilicon/silicide (Poly/WSi, Poly/CoSi$_2$, Poly/NiSi) may be used in addition to W. Therefore, the contact area of the EI contact (the conductive layer 10) and the FG polysilicon film 8a is increased. In other words, the contact area of the EI contact and the FG polysilicon film 8a is determined by the WET etching of the highly selective hard mask 15.

As shown in FIGS. 14A to 14C, a protective film 24 for the W using SiN or SiO$_2$ is formed on the control gate electrode GC. Next, a hard mask for the control gate electrode GC working is formed, a photoresist is formed, and a resist mask for GC working is formed by exposure and development. GC working is then applied to form the groove 13 for isolating the individual electrodes and form a multi-gate structure (see FIGS. 14A to 14C).

Next, impurities are formed on the surface of the silicon substrate 1 at the bottom in the groove 13 by an ion implantation method, and are diffused. In addition, an insulating film between the memory cells is formed as an insulating film between the cell gates in the groove 13, and is flattened, to form an interlayer dielectric. Wirings (not shown) are then formed using a well-known technique.

Here, the step for manufacturing the gate electrode of the peripheral transistor in the peripheral circuit region is almost the same as the step for manufacturing the gate electrode SG of the selector gate transistor in the memory cell region, and the drawing and explanation have been omitted.

With the configuration in this embodiment, while configuring the gate electrode MG of the memory cell transistor to have a flat cell structure, the EI groove 14 with a tunnel shape is formed in the IPD film 9 and the trap film 8b of the gate electrode SG of the selector gate transistor and the gate electrode of the peripheral transistor, conducting the control gate electrode film CG and the FG polysilicon film 8a via the EI groove 14. Therefore, since the selector gate transistor and the peripheral transistor with a monolithic transistor structure (that is, a monolayer gate structure) can be formed, the reliability of the selector gate transistor and the peripheral transistor can be improved. In this configuration, the threshold of the selector gate transistor can be stabilized, thus preventing the degradation of the cut-off characteristic.

In addition, in this embodiment, since the shape of the EI groove 14 is configured so that the width d1 of the bottom opening part is greater than the width d2 of an opening part, with a minimum opening width slightly above the bottom, the contact area of the conductive layer 10 and the FG polysilicon film 8a can be increased, thus lowering the EI contact resistance.

Moreover, since the FG polysilicon film 8a is as thin as 10 nm or less, RIE is difficult to stop in the FG poly electrode. Furthermore, if WET etching is employed instead of the, an HF fluid is required for the removal of the IPD film; however, the HF fluid can also seep into the grain boundaries of the polysilicon on the very thin polysilicon film (the FG poly electrode) causing removal of portions of the tunnel oxide film, degrading the gate breakdown voltage. For this reason, a groove for an EI electrode cannot be formed even by WET etching.

On the other hand, according to the manufacturing method of this embodiment, with the use of the highly selective hard mask 15, even if the FG polysilicon film 8a is thin, the etching of the FG polysilicon film 8a when opening the EI groove 14 can be prevented by using the highly selective mask 15 as an etching stop.

In addition, in this embodiment, since the gate electrode structure of the selector gate transistor and the gate electrode structure of the peripheral transistor are almost the same, and since the memory cell region and the peripheral circuit region can be simultaneously worked and formed, the number of steps can be reduced, thus greatly reducing the manufacturing cost (the bit cost).

Second Embodiment

FIGS. 15A to 37C show a second embodiment. Here, the same symbols are given to the same constituent parts as the constituent parts of the first embodiment. FIG. 15B schematically shows a cross-sectional view along the D-D line of FIGS. 2A and 2B.

In the second embodiment, as shown in FIG. 15B, the gate electrode structure of a peripheral transistor of a peripheral circuit region is a structure without an IPD film or an EI contact. In other words, the tunnel oxide film 7 is formed on the active region 23, and the floating gate electrode FG (the FG polysilicon film 31) comprising a gate electrode, a barrier metal 11, a control gate electrode CG (a conductive layer 10), and a cap film 12 are sequentially provided directly on the tunnel oxide film 7. As shown in FIG. 15A, the gate electrode structure of a memory cell transistor and the gate electrode structure of a selector gate transistor are same as the gate electrode structure of the memory cell transistor and the gate electrode structure of the selector gate transistor of the first embodiment.

Additionally, in the second embodiment, the gate electrode structure of the peripheral transistor of the peripheral circuit region and the gate electrode structure of the memory cell transistor (and the gate electrode structure of the selector gate transistor) are formed in separate steps. Next, an example of the manufacturing method of the NAND-type flash memory cell device of the second embodiment will be explained with reference to an example of the steps shown in the cross-sections of FIGS. 16 to 37. FIGS. 16A to 37A schematically show the manufacturing steps of a cross-sectional structure of a memory cell region corresponding to FIG. 3B. FIGS. 16B to 37B schematically show the manufacturing steps of a cross-sectional structure of a memory cell region corresponding to FIG. 3A. FIGS. 16C to 37C schematically show the manufacturing steps of a cross-sectional structure along the E-E line of FIG. 2B.

As shown in FIGS. 16A to 16C, a silicon oxide film is formed as a tunnel oxide film 30 for a low-voltage transistor of a peripheral circuit region on the surface of the silicon substrate 1 by a thermal oxidation method, for instance. The thickness of the tunnel oxide film 30, for example, is about 5 to 8 nm. In addition, in a part for forming a transistor with a high breakdown voltage in the peripheral circuit region, for example, a silicon oxide film is formed by a well-known method as a tunnel oxide film with a thickness greater than the thickness of the tunnel oxide film 30 for a low-voltage transistor of the peripheral circuit region.

Next, a PG polysilicon film 31, for example, is formed on the tunnel oxide film 30 in the peripheral circuit region by the CVD method. The thickness of the PG polysilicon film 31 is, for example, about 31 nm. A PGPad-SiN film 32 is then formed on the PG polysilicon film 31. The thickness of the PGPad-SiN film 32 is, for example, about 15 nm. Next, a photoresist 33 is spread on the PGPad-SiN film 32, and the resist 33 is patterned by exposure and development so that the memory cell region is opened.

As shown in FIGS. 17A to 17C, using the resist 33 as a mask to protect the peripheral region only, the PGPad-SiN film 32, the PG polysilicon film 31, and the tunnel oxide film 30 of the memory cell region are removed by etching through RIE, for instance.

As shown in FIGS. 18A to 18C, a silicon oxide film is formed as the tunnel oxide film 7 on the surface of the silicon substrate 1 of the memory cell region and on the Pad-SiN film 32by the thermal oxidation method, for instance. The tunnel oxide film 7 functions as a tunnel oxide film (a gate insulating film) of the memory cell transistor and the selector gate transistor.

Next, the FG polysilicon film 8a is formed on the tunnel oxide film 7 of the memory cell region and the PGPad-SiN film 32 of the peripheral circuit region by the CVD method, for instance. The highly selective hard mask 15 an etching stop at a time of RIE of the EI groove 14 on the FG polysilicon film 8a.

Next, the photoresist R1 is spread on the highly selective hard mask 15, and the resist is patterned by exposure and development. Specifically, patterning is carried out so that the highly selective hard mask 15 is left in part where the undercut EI groove 14 (the EI contact) is to be formed. Using the resist R1 as a mask, the highly selective mask 15 is then etched by WET etching, for instance. Thus, the highly selective mask 15 of the peripheral circuit region can be removed. Therefore, a configuration shown in FIGS. 19A to 19C is obtained.

As shown in FIGS. 20A to 20C, the trap film 8b is formed on the FG polysilicon film 8a and the highly selective hard mask 15. As the material of the trap film 8b, SiN, HfO, etc. are preferable. Next, as hard masks for forming the element isolation grooves 4, for example, a silicon oxide film 16 and a Pad-SiN film 35 are formed on the trap film 8b. A photoresist R2 is then spread on the amorphous silicon film 17, and the resist R2 is patterned by exposure and development. Specifically, patterning is carried out so that the peripheral circuit region is opened (exposed). Therefore, a configuration shown in FIGS. 20A to 20C can be obtained.

Next, as shown in FIGS. 21A to 21C, using the resist R2 as a mask, the silicon oxide film 16, the Pad-SiN film 35, the trap film 8b, the FG polysilicon film 8a, and the tunnel oxide film 7 of the peripheral circuit region are removed by etching by RIE, for instance.

Figure 22A:
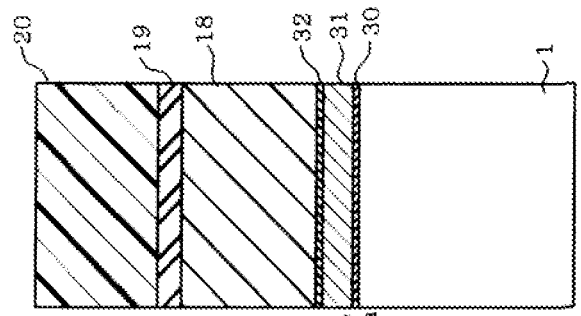
FIG. 22A shows an example (7) of a cross-sectional view along the B-B line of FIG. 2A in the manufacturing process.
Figure 22B:
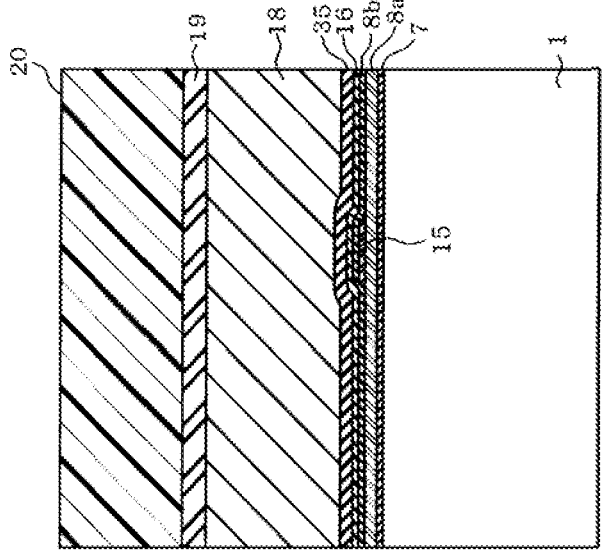
FIG. 22B shows an example (7) of a cross-sectional view along the A-A line of FIG. 2A in the manufacturing process.
Figure 22C:
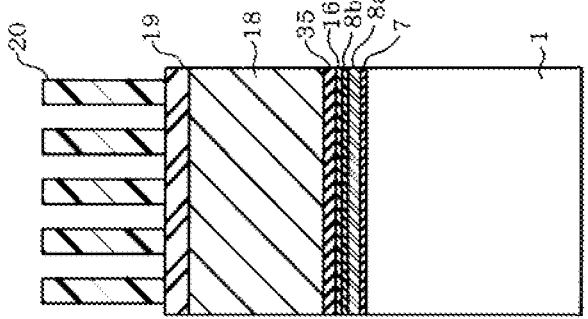
FIG. 22C shows an example (7) of a cross-sectional view illustrating an outlined configuration of the peripheral transistor in the manufacturing process.

Then, as shown in FIGS. 22A to 22C, as a mask for working the element isolation groove 4, for example, an organic carbon group film 18 and an antireflection film 19 employing SiON are formed on the Pad-SiN film 35 and the PGPad-SiN film 32. Next, the photoresist 20 is spread on the antireflection film 19, and the resist 20 is patterned by exposure and development. Specifically, patterning is carried out so that a mask pattern for forming the element isolation groove 4 is formed. Therefore, a configuration shown in FIG. 22 can be obtained.

As shown in FIGS. 23A to 23C, for example, the element isolation grooves 4 are formed using the RIE method. In this case, the element isolation groove is not formed in the peripheral circuit region.

Next, as shown in FIGS. 24A to 24C, an element isolation insulating film 5 is deposited into the element isolation groove 4 by a spreading method, such as a spin on type dielectric deposition method for instance. As the element isolation insulating film 5, a spreading-type oxide film (for example, a polysilazane spreading film) is used. Next, as shown in FIG. 25, a photoresist R3 is spread on the element isolation insulating film 5, and the resist R3 is patterned by exposure and development. Specifically, patterning is carried out so that a mask pattern for forming the element isolation grooves 41 (see FIGS. 26A to 26C) for the peripheral transistor of the peripheral circuit region is formed. Therefore, a structure shown in FIGS. 25A to 25C is obtained.

As shown in FIGS. 26A to 26C, for example, the element isolation groove 41 of the peripheral circuit region is formed using the RIE method. Here, the element isolation groove is not formed in the memory cell region. An element isolation insulating film 51 is deposited into the element isolation groove 41 of the peripheral circuit region by the CVD method, for instance. As the element isolation insulating film 51, for example, a plasma oxide film is used.

Then, as shown in FIGS. 27A to 27C, flattening is performed using the CMP, and the CMP stops on the Pad silicon nitride films (the Pad-SiN film 35 and the PGPad-SiN film 32). Next, as shown in FIGS. 28A to 28C, a photoresist R4 is spread on the element isolation insulating films 5 and 51 and the silicon nitride films 32 and 35, and the resist R4 is patterned by exposure and development. Specifically, a mask pattern for opening the memory cell region is formed. The element isolation insulating film 5 of the memory cell region is then etched away by the RIE method, for instance. Here, the element isolation insulating film 51 of the peripheral circuit region is not worked. The resist layer R4 is then stripped off.

Next, as shown in FIGS. 29A to 29C, the Pad silicon nitride films 32 and 35 and the Pad silicon oxide film 16 are removed using a WET treatment, for instance.

Next, as shown in FIGS. 30A to 30C, the IPD film 9 using SiN, $SiO_2$, HfO, AlO, etc. is formed on the upper surface of the element isolation insulating film 5 and the upper surface of the floating gate electrode FG (the trap film 8b).

Then, as shown in FIGS. 31A to 31C, the mask film 21 for EI groove 14 formation, an antireflection film 22 using SiON, and a photoresist 23 are formed on the IPD film 9. As the material of the mask film 21, for example, $SiO_2$, coating carbon, amorphous carbon, etc. are preferably used. The resist 23 is then patterned by exposure and development. Specifically, patterning is carried out so that a mask pattern for forming the EI opening feature is formed. In this case, the opening part 23a of the resist 23 is patterned so that the opening part is disposed directly over the highly selective hard mask 15.

Next, as shown in FIGS. 32A to 32C, the EI groove 14 is opened using the RIE method, for instance. In this case, the IPD film 9 and the trap film 8b are etched, and the etching stops on the highly selective hard mask 15. Therefore, the EI groove 14 can be formed without etching the underlying very thin FG polysilicon film 8a.

Then, as shown in FIGS. 33A to 33C, the no longer needed hard mask 15, for example, is removed by the WET etching.

Figure 35C:
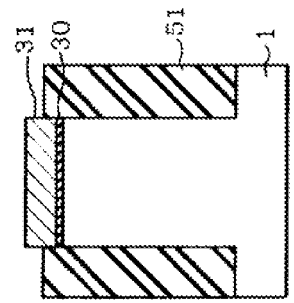
FIG. 35C shows an example (20) of a cross-sectional view illustrating an outlined configuration of the peripheral transistor in the manufacturing process.
Figure 35B:
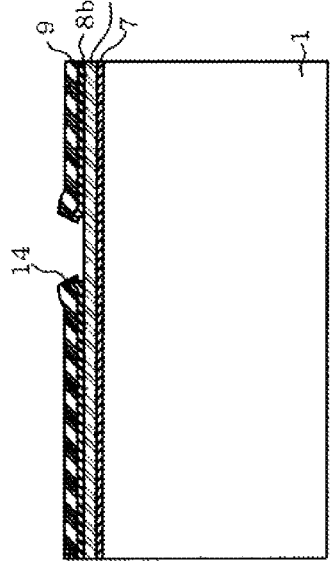
FIG. 35B shows an example (20) of a cross-sectional view along the A-A line of FIG. 2A in the manufacturing process.
Figure 35A:
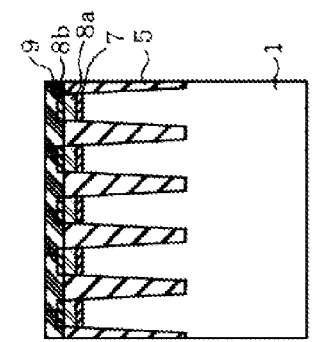
FIG. 35A shows an example (20) of a cross-sectional view along the B-B line of FIG. 2A in the manufacturing process.

Next, as shown in FIGS. 34A to 34C, a photoresist R5 is spread, and the resist R5 is patterned by exposure and development. Specifically, patterning is carried out so that a mask pattern for exposing the peripheral circuit region is formed. The IPD film 9 in the peripheral region is then removed using the RIE method, for instance. After that, a top part of the element isolation insulating film 51 of the peripheral circuit region may be etched back. Then, as shown in FIGS. 35A to 35C, the resist R5 is removed. Here, in one of verification when the step shown in FIGS. 31A to 31C, an opening may be also formed in the resist 23 of the peripheral circuit region, and the IPD film 9 may also be removed by the step shown in FIGS. 32A to 32C. As a result, the step of FIGS. 34 to 35 can be omitted.

Figure 36C:
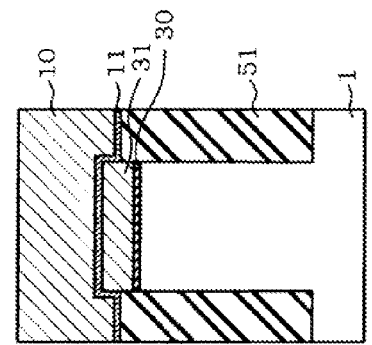
FIG. 36C shows an example (21) of a cross-sectional view illustrating an outlined configuration of the peripheral transistor in the manufacturing process.
Figure 36B:
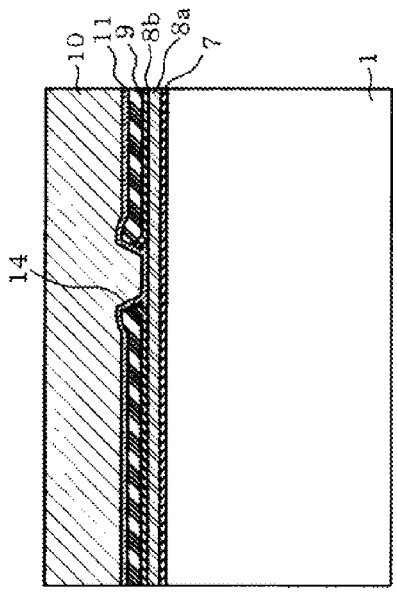
FIG. 36B shows an example (21) of a cross-sectional view along the A-A line of FIG. 2A in the manufacturing process.
Figure 36A:
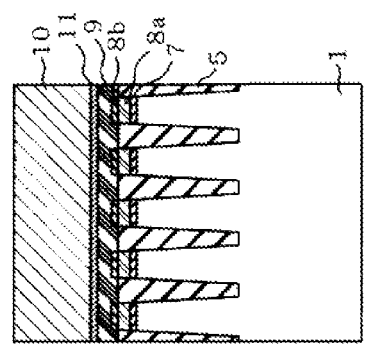
FIG. 36A shows an example (21) of a cross-sectional view along the B-B line of FIG. 2A in the manufacturing process.

Next, as shown in FIGS. 36A to 36C, a barrier metal 11 with a good embedding property is formed on the IPD film 9 of the memory cell region, on the inner surface of the EI groove 14, and on the PG polysilicon film 31 and the element isolation insulating film 51 of the peripheral circuit region. As the barrier metal 11, CVD-WN, CVD-Ti/TiN, ALD (Atomic Layer Deposition)-TaN, etc. can be used. On the barrier metal 11, for example, the conductive layer 10 using W is then formed, and the inside of the EI groove 14 is thus filled with W. Therefore, the control gate electrodes GC and the EI contact are simultaneously formed, thus obtaining a configuration shown in FIGS. 36A to 36C. Here, as the electrode material of the control gate electrode GC (the conductive layer 10), for example, combinations such as polysilicon/W and polysilicon/silicide (Poly/WSi, Poly/$CoSi_2$, Poly/NiSi) may be used in addition to W.

Then, as shown in FIGS. 37A to 37C and 15A and 15B, the protective film 12 for the W using SiN or $SiO_2$ is formed on the control gate electrode GC, a hard mask for working the control gate electrode GC is formed, a photoresist is formed, and a resist mask for GC working is formed by exposure and development. GC etching is then performed to form the groove 13 for electrode isolation, obtaining a multi-gate structure. FIGS. 15A and 15B show an example of a cross-sectional view along the E-E line of FIG. 37C.

Next, impurities are formed on the surface of the silicon substrate 1 at the bottom in the groove 13 by an ion implantation method, followed by diffusion. In addition, an insulating film between the memory cells is formed as an insulating film between the cell gates in the groove 13, is flattened, and is dropped into the groove, forming an interlayer dielectric. Wirings (not shown) are then formed using a well-known technique.

Here, configurations other than the configuration of the second embodiment are the same as the configurations of the first embodiment. Therefore, almost the same operational effects as the operational effects of the first embodiment can also be obtained in the second embodiment.

In addition, in the gate electrodes of the peripheral transistor, the entire upper surface of the PG polysilicon film 31 and the barrier metal 11 can be brought into contact with each other. As a result, the contact resistance of the PG polysilicon film 31 and the control gate electrode 10 of the peripheral transistor can be lowered.

Other Embodiments

In addition to these plural embodiments, the following configuration may also be adopted.

In the previous embodiments, the NAND-type flash memory device has been applied; however, other semiconductor devices having a flat cell structure may also be applied.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
    a semiconductor substrate;
    a memory cell transistor that includes a first gate insulating film on an active region in a memory cell region and a gate electrode in which a first charge storage layer, a first interelectrode insulating film, and a first control gate electrode film are formed one over the other; and
    a transistor that includes a second gate insulating film on the active region in the memory cell region or a peripheral circuit region and a gate electrode in which a second charge storage layer, a second interelectrode insulating film, and a second control gate electrode film are provided one over the other, wherein
    the first and second charge storage layers have a structure in which a polysilicon film and a trap film are formed one over the other; and
    a groove having a funnel shape in a first portion thereof extending through the second interelectrode insulating film and a second portion thereof extending through the trap film, the smallest width of the first portion having a dimension smaller than the smallest width of the second portion, and
    the second control gate electrode film and the polysilicon film of the second charge storage layer are interconnected through the groove.

2. The semiconductor device according to claim 1, wherein
the groove has one or more inflection points, and
a distance between inflection points is smaller than an opening width of the second portion of the groove.

3. The semiconductor device according to claim 1, wherein
a width in a channel width direction of the second charge storage layer of the transistor is greater than a width in the channel width direction of the first charge storage layer of the memory cell transistor.

4. The semiconductor device according to claim 1, wherein
a depth of an element isolation groove for isolating the active region of the transistor is less than a depth of an element isolation groove for isolating the active region of the memory cell transistor.

5. The semiconductor device according to claim 1, wherein
the transistor is a selector gate transistor adjacent to the memory cell transistor.

6. The semiconductor device of claim 1, wherein the second portion of the groove extends between the charge storage layer and second interelectrode insulating film.

7. The semiconductor device of claim 1, wherein the second portion of the groove extends under both sides of the second interelectrode insulating film.

8. A semiconductor memory device comprising:
a plurality of memory cells;
at least one selector gate transistor having a gate;
an interlayer dielectric partially overlying the selector gate transistor, and having a tapered, undercut, profile groove extending therethrough; and
a contact extending inwardly of the groove and into the undercut portion of the groove and electrically contacting a polysilicon film layer.

9. The semiconductor memory device of claim 8, wherein the contact includes a barrier layer.

10. The semiconductor memory device of claim 8, wherein the gate is a polysilicon gate.

11. The semiconductor memory device of claim 8, wherein the plurality of memory cells are separated from one another by an isolation groove, and the isolation grooves are narrower than the width of the undercut region of the groove in the interlayer dielectric.

12. The semiconductor memory device of claim 8, wherein the gate is a polysilicon gate that is less than 10 nm thick.

13. The semiconductor memory device of claim 12, wherein the tapered, undercut profile groove is formed by etching.

14. A semiconductor device comprising:
a semiconductor substrate;
a memory cell transistor that includes a first gate insulating film on an active region in a memory cell region and a gate electrode in which a first charge storage layer, a first interelectrode insulating film, and a first control gate electrode film are formed one over the other; and
a transistor that includes a second gate insulating film on the active region in the memory cell region or a peripheral circuit region and a gate electrode in which a second charge storage layer, a second interelectrode insulating film, and a second control gate electrode film are provided one over the other, wherein
the first and second charge storage layers have a structure in which a polysilicon film and a trap film are formed one over the other; and
a groove having a funnel shape is formed through the trap film and having a protruded portion on a side of the groove, and
the second control gate electrode film and the polysilicon film of the second charge storage layer are interconnected through the groove.

15. The semiconductor device of claim 14, wherein the groove has a first opening and a second opening, and the first opening has a width that is greater than a width of the second opening.

16. The semiconductor device according to claim 14, wherein
a width in a channel width direction of the second charge storage layer of the transistor is greater than a width in the channel width direction of the first charge storage layer of the memory cell transistor.

17. The semiconductor device according to claim 14, wherein
a depth of an element isolation groove for isolating the active region of the transistor is less than a depth of an element isolation groove for isolating the active region of the memory cell transistor.

18. The semiconductor device according to claim 14, wherein
the transistor is a selector gate transistor adjacent to the memory cell transistor.

19. The semiconductor device according to claim 14, further comprising:
a plurality of memory cells;
at least one selector gate transistor having a gate;
an interlayer dielectric partially overlying the selector gate transistor, and having a tapered, undercut, profile groove extending therethrough; and
a contact extending inwardly of the groove and into the undercut portion of the groove.

20. The semiconductor memory device of claim 19, wherein the gate is a polysilicon gate and is contacted by the contact.

* * * * *